(12) United States Patent
Chang et al.

(10) Patent No.: US 12,500,174 B2
(45) Date of Patent: Dec. 16, 2025

(54) POWER MODULE

(71) Applicant: PowerX Semiconductor Corporation, Hsinchu County (TW)

(72) Inventors: Jing-Yao Chang, Hsinchu County (TW); Tai-Jyun Yu, Hsinchu County (TW); Sheng-Tsai Wu, Hsinchu County (TW)

(73) Assignee: PowerX Semiconductor Corporation, Hsinchu County (TW)

( * ) Notice: Subject to any disclaimer, the term of this patent is extended or adjusted under 35 U.S.C. 154(b) by 474 days.

(21) Appl. No.: 18/172,336

(22) Filed: Feb. 22, 2023

(65) Prior Publication Data

US 2024/0213165 A1 Jun. 27, 2024

(30) Foreign Application Priority Data

Dec. 21, 2022 (TW) .................................. 111149285

(51) Int. Cl.
*H01L 23/538* (2006.01)
*H01L 23/00* (2006.01)
(Continued)

(52) U.S. Cl.
CPC ...... *H01L 23/5381* (2013.01); *H01L 23/3735* (2013.01); *H01L 23/5386* (2013.01);
(Continued)

(58) Field of Classification Search
CPC ............. H01L 23/5381; H01L 23/3735; H01L 23/5386; H01L 24/29; H01L 24/32; H01L 24/33; H01L 24/45; H01L 24/48; H01L 24/73; H01L 25/0655; H01L 2224/29139; H01L 2224/29147; H01L 2224/32227; H01L 2224/32245; H01L 2224/3303; H01L 2224/33181; H01L 2224/45124; H01L 2224/45147; H01L 2224/45624; H01L 2224/48091; H01L 2224/48106; H01L 2224/48227; H01L 2224/73215; H01L 2224/73265
(Continued)

(56) References Cited

U.S. PATENT DOCUMENTS 6,421,244 B1 * 7/2002 Shinohara ............... H01L 23/24
361/783
7,592,688 B2 * 9/2009 Standing .................. H01L 24/73
257/725
(Continued)

FOREIGN PATENT DOCUMENTS

CN 110391215 A 10/2019
CN 110622301 A 12/2019
(Continued)

*Primary Examiner* — Jasmine J Clark
(74) *Attorney, Agent, or Firm* — CKC & Partners Co., LLC

(57) ABSTRACT

A power module includes a substrate, chips, supporting pillars, a metal plate and bonding bodies is disclosed. The substrate includes a metallic layer. The chips are on the metallic layer of the substrate, and each of the chips includes a source, a gate, and a drain. The supporting pillars are on the chips. The metal plate is on the supporting pillars and connected with the supporting pillars. The bonding bodies connect the metal plate and the metallic layer.

20 Claims, 26 Drawing Sheets

(51) Int. Cl.
*H01L 23/373* (2006.01)
*H01L 25/065* (2023.01)

(52) U.S. Cl.
CPC .............. *H01L 24/29* (2013.01); *H01L 24/32* (2013.01); *H01L 24/33* (2013.01); *H01L 24/45* (2013.01); *H01L 24/48* (2013.01); *H01L 24/73* (2013.01); *H01L 25/0655* (2013.01); *H01L 2224/29139* (2013.01); *H01L 2224/29147* (2013.01); *H01L 2224/32227* (2013.01); *H01L 2224/32245* (2013.01); *H01L 2224/3303* (2013.01); *H01L 2224/33181* (2013.01); *H01L 2224/45124* (2013.01); *H01L 2224/45147* (2013.01); *H01L 2224/45624* (2013.01); *H01L 2224/48091* (2013.01); *H01L 2224/48106* (2013.01); *H01L 2224/48227* (2013.01); *H01L 2224/73215* (2013.01); *H01L 2224/73265* (2013.01)

(58) Field of Classification Search
USPC ........................................................ 257/678
See application file for complete search history.

(56) References Cited

U.S. PATENT DOCUMENTS

| | | | |
|---|---|---|---|
| 9,136,193 | B2* | 9/2015 | Minamio .............. H01L 23/053 |
| 10,483,216 | B2 | 11/2019 | Yoshihara |
| 11,302,665 | B2 | 4/2022 | Otsuka et al. |
| 2008/0054425 | A1* | 3/2008 | Malhan .................. H01L 24/01 |
| | | | 257/E25.016 |
| 2022/0093552 | A1 | 3/2022 | Takeda |

FOREIGN PATENT DOCUMENTS

| | | |
|---|---|---|
| CN | 113257691 A | 8/2021 |
| CN | 113851444 A | 12/2021 |
| TW | M640625 U | 5/2023 |

* cited by examiner

POWER MODULE

CROSS-REFERENCE TO RELATED APPLICATION

This application claims priority to Taiwan Application Serial Number 111149285, filed Dec. 21, 2022, which is herein incorporated by reference in its entirety.

BACKGROUND

Field of Invention

The present disclosure relates to a power module.

Description of Related Art

Power modules are packages including multiple power devices (such as power semiconductor chips). The power devices may be disposed upon a substrate, and electrodes of the power devices may be connected to certain terminals by wirings. The applications of the power modules may be typical in transportations and industrial systems. For example, the power modules may be used in motor drivers, inverters, converters, power supplies or other devices.

SUMMARY

Some of the embodiments of the present disclosure provide a power module including a substrate, a plurality of chips, a plurality of supporting pillars, a metal plate and a plurality of bonding bodies. The substrate includes a metallic layer. The chips are on the metallic layer of the substrate, and each of the chips includes a source, a gate, and a drain. The supporting pillars are on the chips. The metal plate is on the supporting pillars and connected with the supporting pillars. The bonding bodies connect the metal plate and the metallic layer.

In some embodiments, a gap is between the chips, and the bonding bodies are on the metal plate and right above the chips and the gap at the same time.

In some embodiments, the bonding bodies are a plurality of wires or ribbons.

In some embodiments, each of the supporting pillars connects the source of one of the chips and the metal plate.

In some embodiments, the power module further includes a plurality of wires on the chips and connected with the metallic layer. The metallic layer includes a drain pattern, a source pattern and a gate pattern. The chips are disposed upon the drain pattern, and the drain of each of the chips is connected with the drain pattern. The source pattern is adjacent to the drain pattern and is spaced apart from the drain pattern, and the bonding bodies connect the source pattern and the metal plate. The gate pattern is adjacent to the drain pattern and is spaced apart from the drain pattern, wherein the wires connect the gate pattern and the gate of each of the chips.

In some embodiments, the power module further includes a first terminal connected with the source pattern, a second terminal connected with the drain pattern, and a fourth terminal connected with the gate pattern.

In some embodiments, the metallic layer includes a source pattern, a drain pattern and a gate pattern. The chips are disposed upon the source pattern, and the source of each of the chips is connected with the source pattern. The drain pattern is adjacent to the source pattern and is spaced apart from the source pattern, and the bonding bodies connect the drain pattern and the metal plate. The gate pattern is adjacent to the source pattern and is spaced apart from the source pattern, wherein the gate pattern is connected with the gate of each of the chips.

In some embodiments, the bonding bodies are a plurality of metal pillars or bonding materials.

In some embodiments, the metal plate includes a recess structure on the supporting pillars.

In some embodiments, the metal plate bends toward the metallic layer, and a bending portion of the metal plate extends along the metallic layer.

Some of the embodiments of the present disclosure provide a power module including a substrate, a plurality of chips, a plurality of supporting pillars, a metal plate and a plurality of bonding bodies. The substrate includes a metallic layer. The chips are on the metallic layer of the substrate, and each of the chips includes a source, a gate, and a drain. The supporting pillars are on the chips. The metal plate is on the supporting pillars and connected with the supporting pillars, and the metal plate has a plurality of holes. The bonding bodies connect the metal plate and the metallic layer, and the holes of the metal plate do not overlap the bonding bodies.

In some embodiments, each of the bonding bodies electrically connects the sources of chips and the metallic layer.

In some embodiments, the power module further includes a plurality of wires on the chips and connected with the metallic layer. The metallic layer includes a drain pattern, a source pattern and a gate pattern. The chips are disposed upon the drain pattern, and the drain of each of the chips is connected with the drain pattern. The source pattern is adjacent to the drain pattern and is spaced apart from the drain pattern, and the bonding bodies connect the source pattern and the metal plate. The gate pattern is adjacent to the drain pattern and is spaced apart from the drain pattern, and the wires connect the gate pattern and the gate of each of the chips.

In some embodiments, the power module further includes a baseplate under the substrate, and a housing surrounding the baseplate.

In some embodiments, the power module further includes a first terminal, a second terminal and a third terminal. The first terminal is connected with the source pattern, and the first terminal is on the housing. The second terminal is connected with the drain pattern, and the second terminal is on the housing. The third terminal is on the gate pattern, and the third terminal is a pin terminal.

In some embodiments, the power module further includes a first terminal, a second terminal and a third terminal. The first terminal is connected with the source pattern, and the first terminal is on the housing. The second terminal is connected with the drain pattern, and the second terminal is on the housing. The fourth terminal is connected with the gate pattern.

In some embodiments, the metal plate extends to right above the gate of at least one of the chips.

In some embodiments, the supporting pillars and the chips are electrically connected by bonding materials, and the hardness of the bonding materials is lower than that of the supporting pillars and the chips.

In some embodiments, the supporting pillars and the metal plate are electrically connected by bonding materials, and the bonding materials are solder or silver sintering.

In some embodiments, each of the supporting pillars connects the source of one of the chips and the metal plate.

In some embodiments of the present disclosure, the supporting pillars, the metal plate and the bonding materials are used to enhance the reliability of the power module and reduce the stress accumulation of the power module. Moreover, the current uniformity and heat dissipation effect of the power module may be enhanced.

It is to be understood that both the foregoing general description and the following detailed description are by examples, and are intended to provide further explanation of the description as claimed.

DETAILED DESCRIPTION

Figure 1:
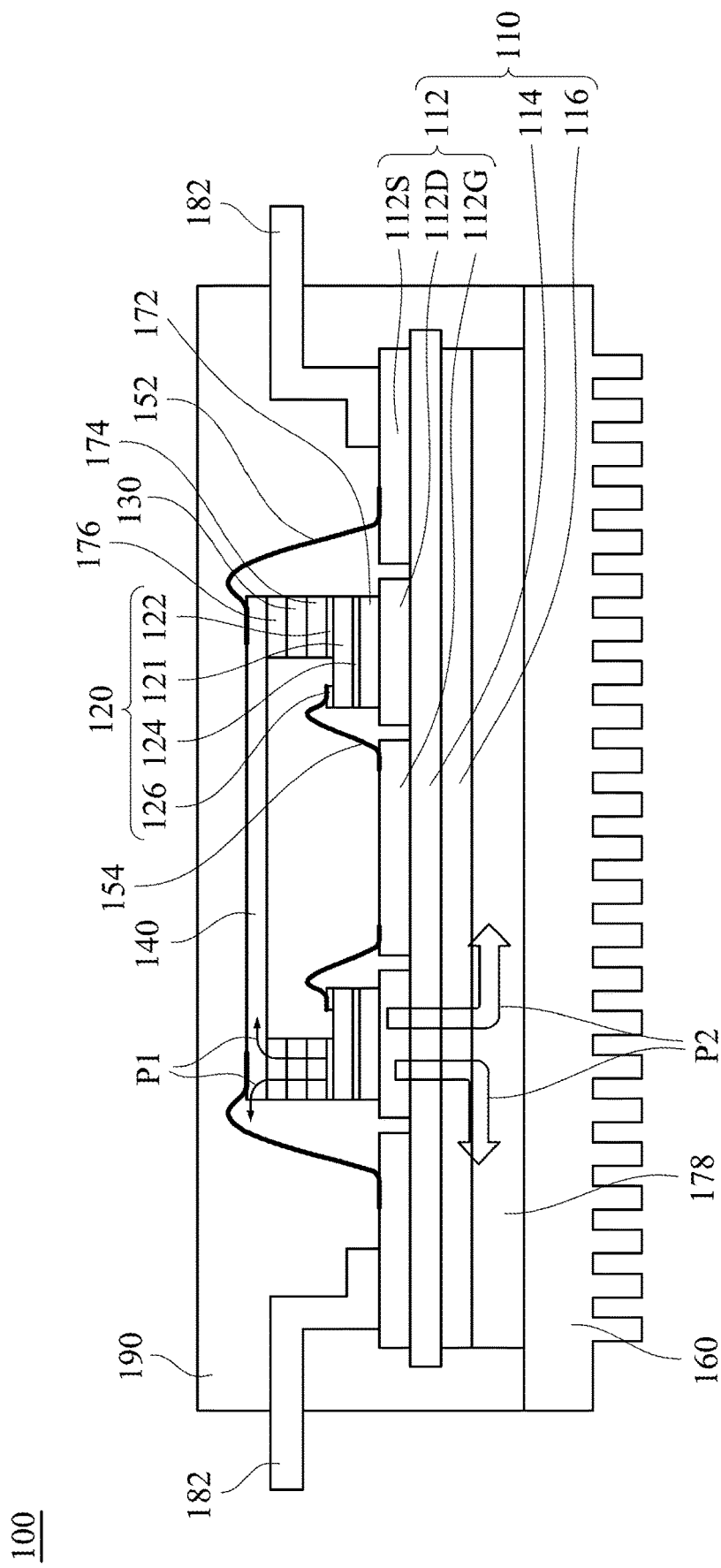
FIG. 1 illustrates a cross-section view of a power module in some embodiments of the present disclosure.
Figure 2:
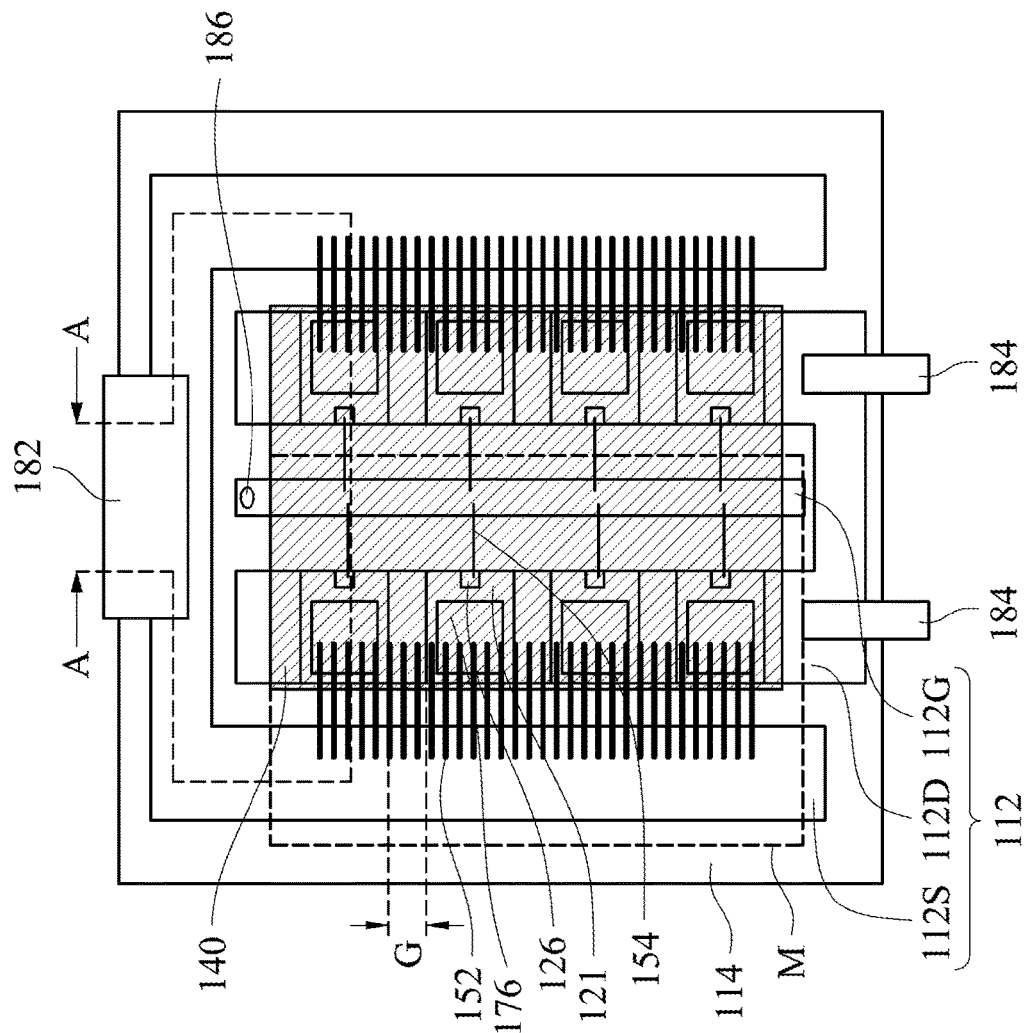
FIG. 2 illustrates a top view of the power module in some embodiments of the present disclosure.

FIG. 1 illustrates a cross-section view of a power module 100 in some embodiments of the present disclosure. FIG. 2 illustrates a top view of the power module 100 in some embodiments of the present disclosure, and FIG. 1 is taken along the cross-section A-A in FIG. 2. Referring to FIGS. 1 and 2, the power module 100 includes a substrate 110, a plurality of chips 120, supporting pillars 130, a metal plate 140, bonding bodies 152 and wires 154. The substrate 110 includes a metallic layer 112. The chips 120 are on the metallic layer 112 of the substrate 110, and each of the chips 120 include a source 122, a drain 124 and a gate 126. The supporting pillars 130 are on the chips 120. The metal plate 140 is on the supporting pillars 130 and connected with the supporting pillars 130. The bonding bodies 152 connect the metal plate 140 and the metallic layer 112. The wires 154 are on the chips 120 and connected with the metallic layer 112.

The substrate 110 may include the metallic layer 112, an insulation layer 114 and a conductive layer 116. The metallic layer 112 is on the insulation layer 114, and the insulation layer 114 is on the conductive layer 116. That is, the conductive layer 116 and the metallic layer 112 are entirely separated from each other by the insulation layer 114. The metallic layer 112 may include a drain pattern 112D, a source pattern 112S and a gate pattern 112G. The conductive layer 116 may be used for dissipation, and the conductive layer 116 may also make it easier to connect the substrate 110 with the underlying baseplate (baseplate 160 in later discussion). In some embodiments, the metallic layer 112 and the conductive layer 116 may be made of metal, such as copper, and the insulation layer 114 may be made of ceramic. The source pattern 112S is adjacent to the drain pattern 112D and is spaced apart from the drain pattern 112D, and the gate pattern 112G is adjacent to the drain pattern 112D and is spaced apart from the drain pattern 112D. In some embodiments, the shapes of the source pattern 112S, the drain pattern 112D and the gate pattern 112G are shown in FIG. 2. For example, the drain pattern 112D is at two sides of the gate pattern 112G of the power module 100, the source pattern 112S is at two sides of the entire portion of the drain pattern 112D. However, FIG. 2 is merely an example, and is not used to limit the shapes or configurations of the source pattern 112S, the drain pattern 112D and the gate pattern 112G.

A plurality of the chips 120 are arranged on the substrate 110. Each of the chips 120 includes a semiconductor layer 121, the source 122, the drain 124 and the gate 126. The source 122 and the gate 126 is at one side of the semiconductor layer 121, and the drain 124 is at the other side of the semiconductor layer 121. The side where the source 122 and the gate 126 are located is opposite to the side where the drain 124 is located. More specifically, the chips 120 are disposed on the drain pattern 112D, and the drain 124 of each of the chips 120 is connected with the drain pattern 112D by the bonding material 172. The chips 120 may be any suitable chips, such as metal oxide semiconductor field effect transistor (MOSFET) chip, insulated gate bipolar transistor (IGBT) chip, and diode chip.

The supporting pillars 130 are on the sources 122 of the chips 120, and the metal plate 140 is on the supporting pillars 130 and covers the supporting pillars 130. That is, each of the supporting pillars 130 connects the source 122 of each of the chips 120 and the metal plate 140. More specifically, each of the supporting pillars 130 is connected with the source 122 of each of the chips 120 by the bonding material 174, and connected with the metal plate 140 by the bonding material 176. Since the metal plate 140 covers multiple chips 120 at the same time, and a gap G is between the chips 120, the metal plate 140 covers the gap G between the chips 120 at the same time. The supporting pillar 130 and the metal plate 140 are both made of conductive material. In some embodiments, the supporting pillars 130 may be made of copper or copper-molybdenum stack. The metal plate 140 may be made of copper.

The bonding bodies 152 are on the metal plate 140 and electrically connected with the metallic layer 112. More specifically, the bonding bodies 152 electrically connect with the source pattern 112S and the metal plate 140. The bonding bodies 152 may be right above the chips 120, and the bonding bodies 152 may be on the metal plate 140 and right above the chips 120 and the gap G at the same time. When the bonding bodies 152 electrically connect with the source pattern 112S and the metal plate 140, the bonding bodies 152 are not entirely straightened. In other words, the bonding bodies 152 have certain curvature (or bonding bodies 152 are slack). When the bonding bodies 152 are thermally extended or contracted due to heat dissipated from the chips 120, the stress is less likely to accumulate in the bonding bodies 152. In some embodiments, the bonding bodies 152 are bonded with the substrate 110 and the metal plate 140 at room temperature by performing ultrasonic bonding.

The wires 154 are on the chips 120 and electrically connected with the metallic layer 112. More specifically, the wires 154 electrically connect with the gate pattern 112G and the gate 126 of each of the chips 120. The wires 154 may be made of any suitable conductive material, such as aluminum, copper wrapped by aluminum, or copper. In some embodiments, the wires 154 are bonded with the substrate 110 and the chips 120 at room temperature by performing ultrasonic bonding.

The power module 100 also includes a baseplate 160. The baseplate 160 is under the substrate 110. In some embodiments, the baseplate 160 includes pillar structures at the bottom to increase the dissipation area of the power module 100.

The power module 100 also includes bonding materials 172, 174, 176 and 178. The bonding materials 172 electrically connect the chips 120 and the drain pattern 112D of the metallic layer 112. The bonding materials 174 electrically connect the supporting pillars 130 and the chips 120. The bonding materials 176 electrically connect the supporting pillars 130 and the metal plate 140. The bonding material 178 electrically connects the substrate 110 and the baseplate 160. The bonding materials 172, 174, 176 and 178 may be made of conductive materials with lower hardness, such as solder or silver sintering, or other conductive materials, such as copper sintering. The hardness of the bonding materials 172, 174, 176 and 178 may be chosen that the hardness of the bonding materials 172, 174, 176 and 178 is lower than other components connected by the bonding material 172, 174, 176 and 178. For example, the hardness of the bonding material 174 is lower than that of the supporting pillar 130 and the chips 120.

The power module 100 further includes the first terminal 182, the second terminal 184 and the molding gel 190. The first terminal 182 is electrically connected with the source pattern 112S. The second terminal 184 is electrically connected with the drain pattern 112D. When the power module 100 is a molding-type module, the power module 100 further includes a third terminal 186. The third terminal 186 is on the gate pattern 112G, and the third terminal 186 is a pin terminal. A voltage may be provided from the third terminal 186 to the gates 126 of the chips 120 to turn on the chips in the power module 100. The sources 122 and the drains 124 of the chips have a potential difference, so the current flows from the second terminal 184 through the drain pattern 112D, the drains 124 of the chips 120, the sources 122 of the chips 120, the supporting pillars 130, the metal plate 140, the bonding bodies 152, the source pattern 112S to the first terminal 182. That is, the chips 120 of the power module 100 are connected with each other in parallel. The molding gel 190 covers the baseplate 160, the substrate 110, the metal plate 140, the first terminal 182, the second terminal 184 and the chips 120. In some embodiments, the molding gel 190 is on the baseplate 160 and covers all components of the power module 100. In some embodiments, the molding gel 190 may be made of epoxy, silica gel, or the like. It is noted that the molding gel 190 is omitted in FIG. 2 for simplicity.

Figure 3:
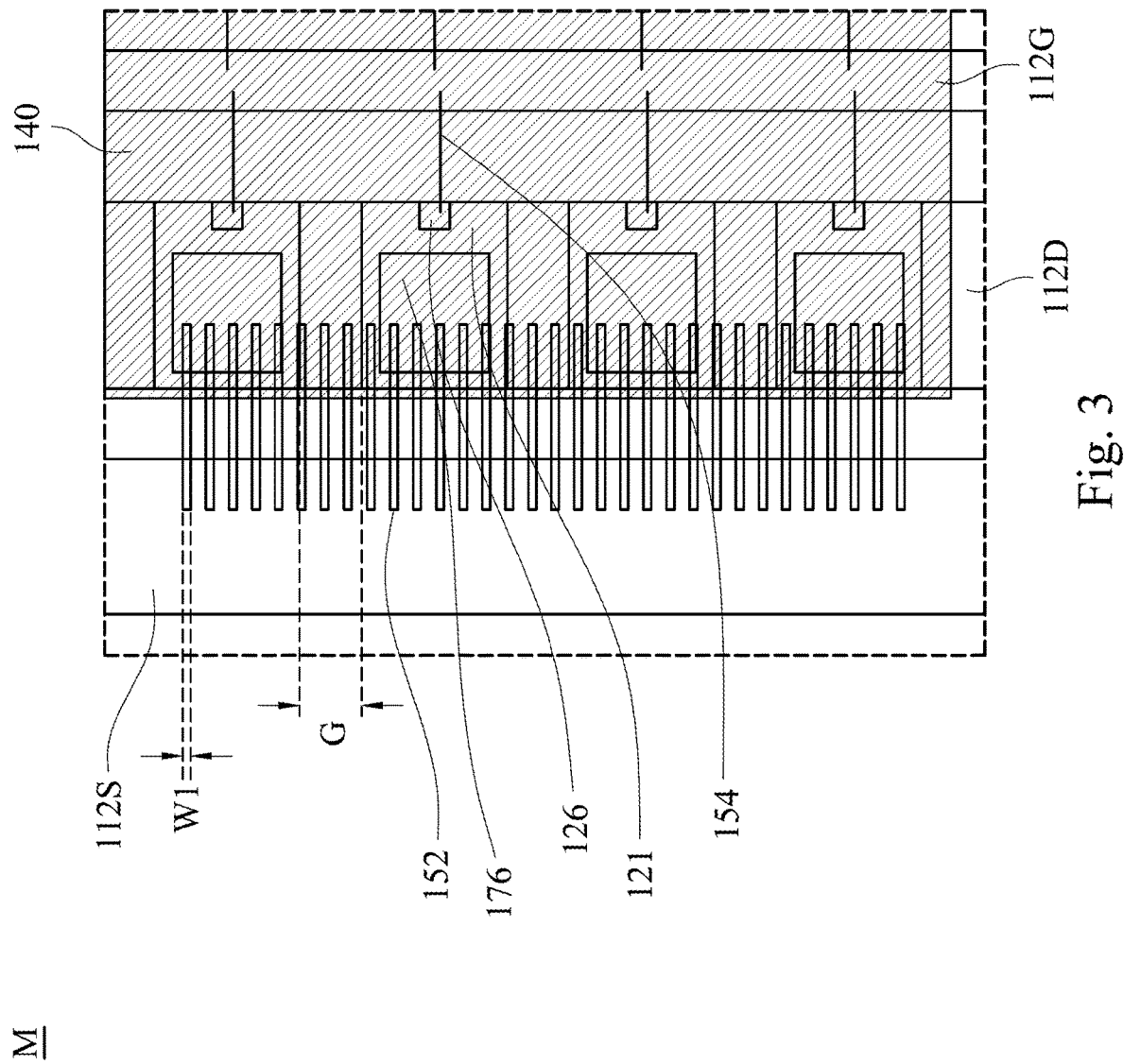
FIG. 3 illustrates an enlargement view of region M in FIG. 2.

FIG. 3 illustrates an enlargement view of region M in FIG. 2. FIG. 3 emphasizes the structures of FIG. 3 in some embodiments of the present disclosure to achieve some advantages. Referring to FIGS. 1 and 3, the supporting pillars 130 and the metal plate 140 accompanied by the bonding materials 174 and 176 may be used to reduce the stress of the power module 100 and enhance the reliability of the power module 100. More specifically, the supporting pillars 130 electrically connect with the metal plate 140 and the sources 122 of the chip 120, the bonding materials 174 are bonded with the chips 120 and the supporting pillars 130, and the bonding materials 176 are bonded with the supporting pillars 130 and the metal plate 140. If the metal plate 140 is applied by an external force in the process of the power module 100, the supporting pillars 130, the bonding materials 174 and 176 may serve as cushions to reduce the stress accumulated between the bonding materials 174 and the chips 120. For example, the supporting pillar 130 has a certain height, so that the metal plate 140 and the chip 120 have a distance therebetween. The hardness of the bonding materials 174 and 176 are small, so when the metal plate 140 moves and makes the supporting pillar 130 move, the bonding materials 174 and 176 may provide cushioning. Moreover, the metal plate 140 does not extend to the metallic layer 112 and is not bonded with the metallic layer 112, so that the issue, which results from mismatch between the coefficient of thermal expansion of the materials due to increasing and decreasing temperature during the bonding process (such as solder or aluminum sintering process), and the thermal stress accumulation issue are relatively small. Thermal stress resulting from the high temperature does not accumulate in the metallic layer 112.

Moreover, the supporting pillars 130 and the metal plate 140 in some embodiments of the present disclosure may be used to increase current uniformity and dissipation capability. The metal plate 140 is electrically connected with multiple chips 120 at the same time, and covers the gap G between the chips 120 at the same time. The bonding bodies 152 may be densely distributed on the metal plate 140. A portion of the bonding bodies 152 may be directly above the chips 120. Some other portion of the bonding bodies 152 may be directly above the gap G between the chips 120. As such, when the current flows to the sources 122 of the chips 120, the current to the sources 122 of the chips 120 may be shared to every bonding body 152 evenly to achieve current uniformity. When the chips 120 are in operation, the dissipation heat may go up along the supporting pillars 130 and diffuse through the metal plate 140 (as path P1 shown in FIG. 1), or diffuse through the metal plate 140 to the bonding bodies 152, or go down and diffuse through baseplate 160 (as path P2 shown in FIG. 1). Since the area of the metal plate 140 is larger than the area of the upper surface of the chips 120, the metal plate 140 may largely dissipate the heat diffused from the chips 120. Less heat is transferred to the bonding bodies 152, so the thermal stress is not likely to accumulate in the bonding bodies 152. In some embodiments, the bonding bodies 152 may be wires, as shown in FIG. 3. When the bonding bodies 152 are wires, the wire diameter W1 is between 75 micrometers and 500 micrometers. The bonding bodies 152 may be made of any suitable conductive material, such as aluminum, copper wrapped by aluminum, or copper.

Figure 4:
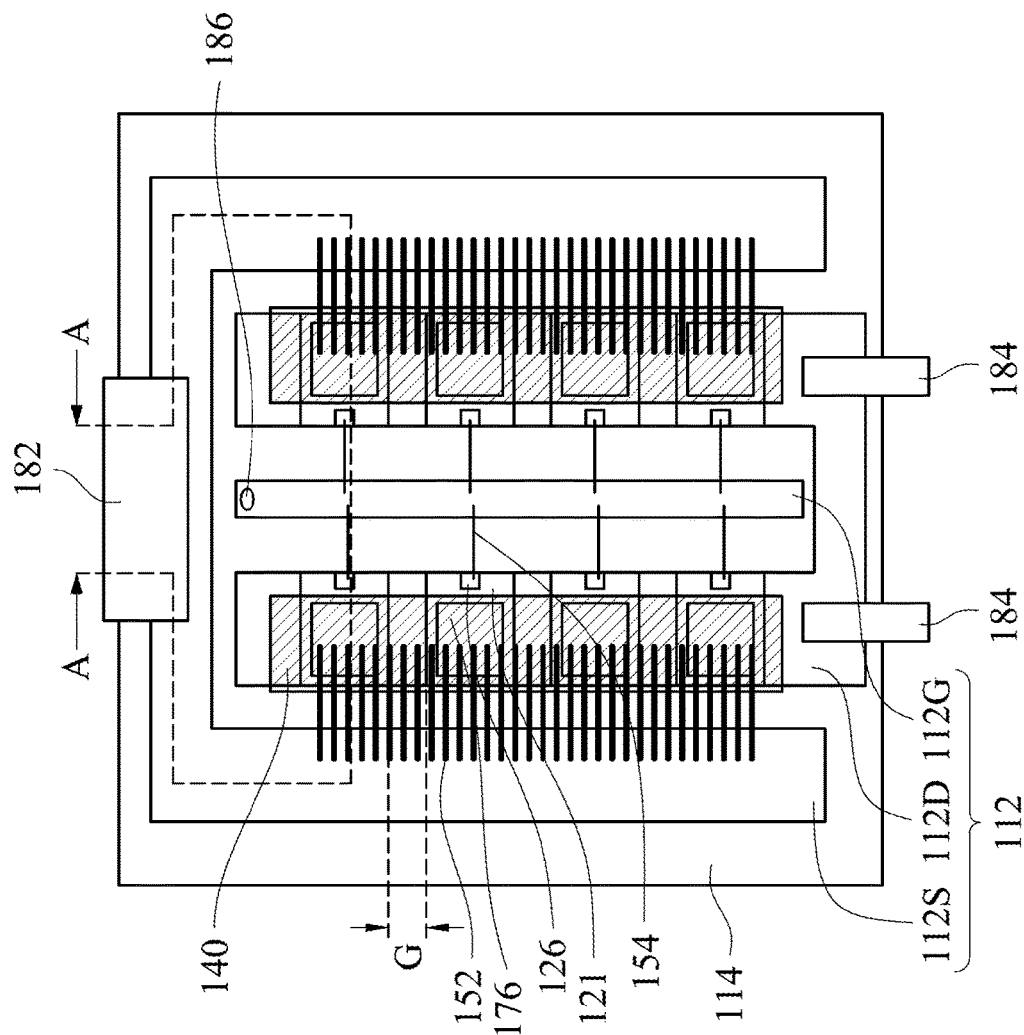
FIG. 4 illustrates a top view of a power module in some other embodiments of the present disclosure.

FIG. 4 illustrates a top view of the power module 100 in some other embodiments of the present disclosure. The power module 100 in FIG. 4 is similar to the power module 100 in FIG. 2. The difference is that the metal plate 140 of the power module 100 in FIG. 2 extends to right above the gates 126 of the chips 120, and the metal plate 140 of the power module 100 in FIG. 4 does not extend to right above the gates 126 of the chips 120. The area of the metal plate 140 of the power module 100 is still larger than the area of the upper surface of the chips 120. Therefore, the metal plate 140 still provides enough dissipation capability.

Figure 5:
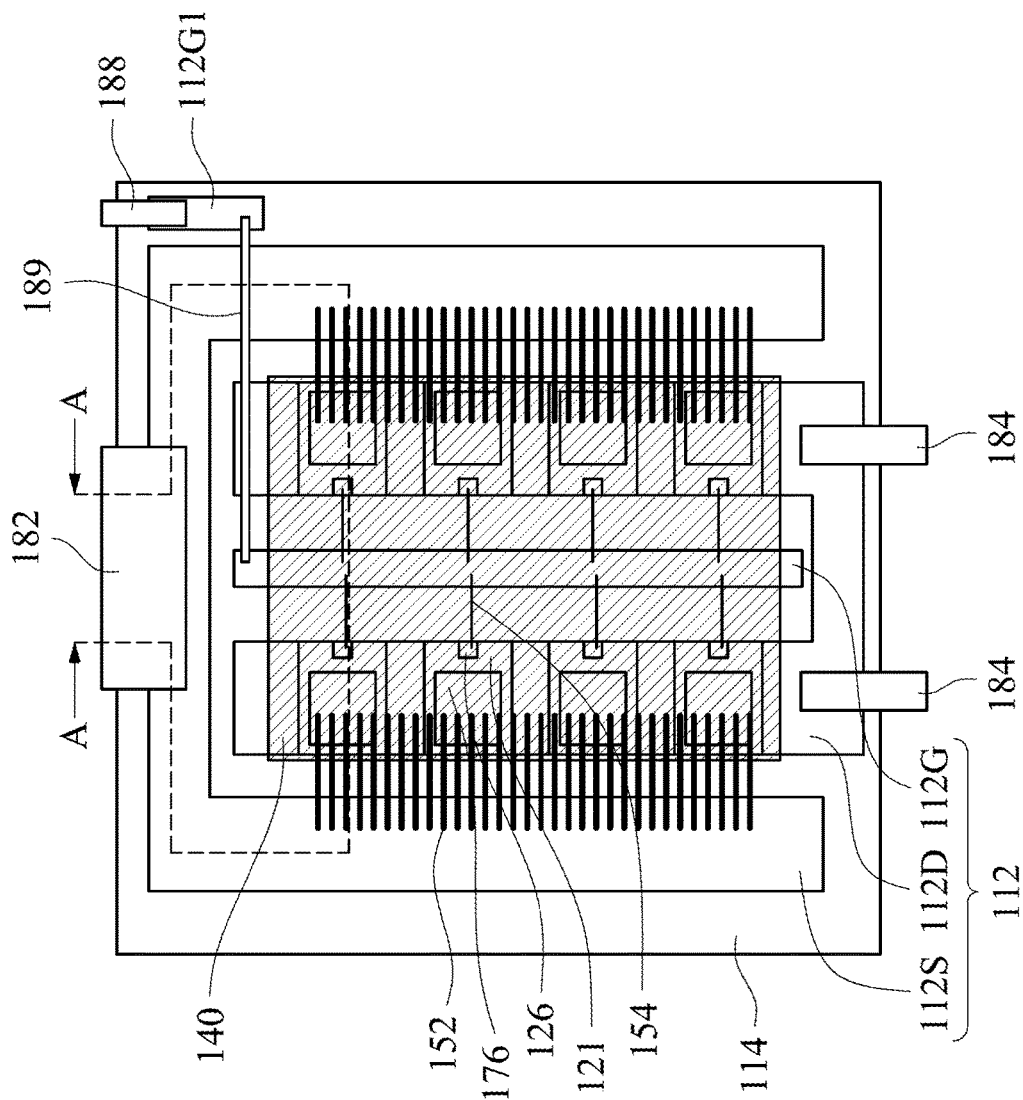
FIG. 5 illustrates a top view of a power module in some other embodiments of the present disclosure.

FIG. 5 illustrates a top view of the power module 100 in some other embodiments of the present disclosure. Compared to FIG. 2, the difference between FIG. 2 and FIG. 5 is that the power module 100 in FIG. 5 does not include the third terminal 186. The power module 100 in FIG. 5 includes a fourth terminal 188 electrically connected with the gate pattern 112G. The power module 100 may further include a gate pattern 112G1, and the fourth terminal 188 is on the gate pattern 112G1. The fourth terminal 188 and gate pattern 112G are electrically connected by a bridge 189. The bridge 189 is conductive and only in contact with the gate pattern 112G and the gate pattern 112G1. Therefore, the fourth terminal 188 is not electrically connected with the source pattern 112S and the drain pattern 112D. A voltage may be provided from the fourth terminal 188 to the gates 126 of the chips 120 to turn on the chips in the power module 100. The sources 122 and the drains 124 of the chips have a potential difference, so the current flows from the second terminal 184 through the drain pattern 112D, the drains 124 of the chips 120, the sources 122 of the chips 120, the supporting pillars 130, the metal plate 140, the bonding bodies 152, the source pattern 112S to the first terminal 182.

Figure 6:
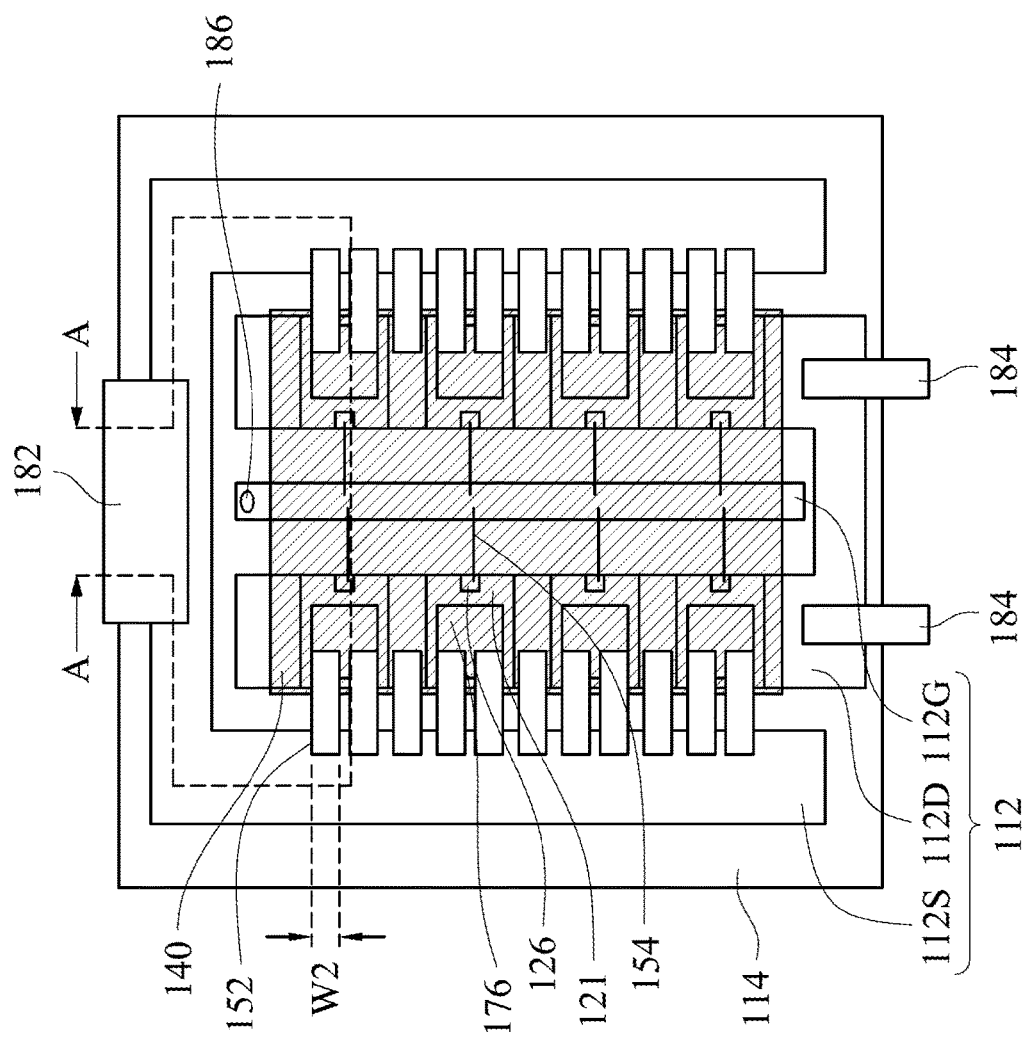
FIG. 6 illustrates a top view of a power module in some other embodiments of the present disclosure.

FIG. 6 illustrates a top view of the power module 100 in some other embodiments of the present disclosure. The power module 100 in FIG. 6 is similar to the power module 100 in FIG. 2. The difference is that the bonding bodies 152 of the power module 100 in FIG. 6 are ribbons, and the width W2 of the ribbons are between 1 millimeter and 2 millimeters. When the bonding bodies 152 are ribbons, the widths of the ribbons are larger and it is more likely to achieve the current uniformity. Moreover, the bonding bodies 152 are directly on the metal plate 140 instead of in contact with the chips 120. Therefore, the widths of the bonding bodies 152 are not limited by the sizes of the chips 120.

Figure 7:
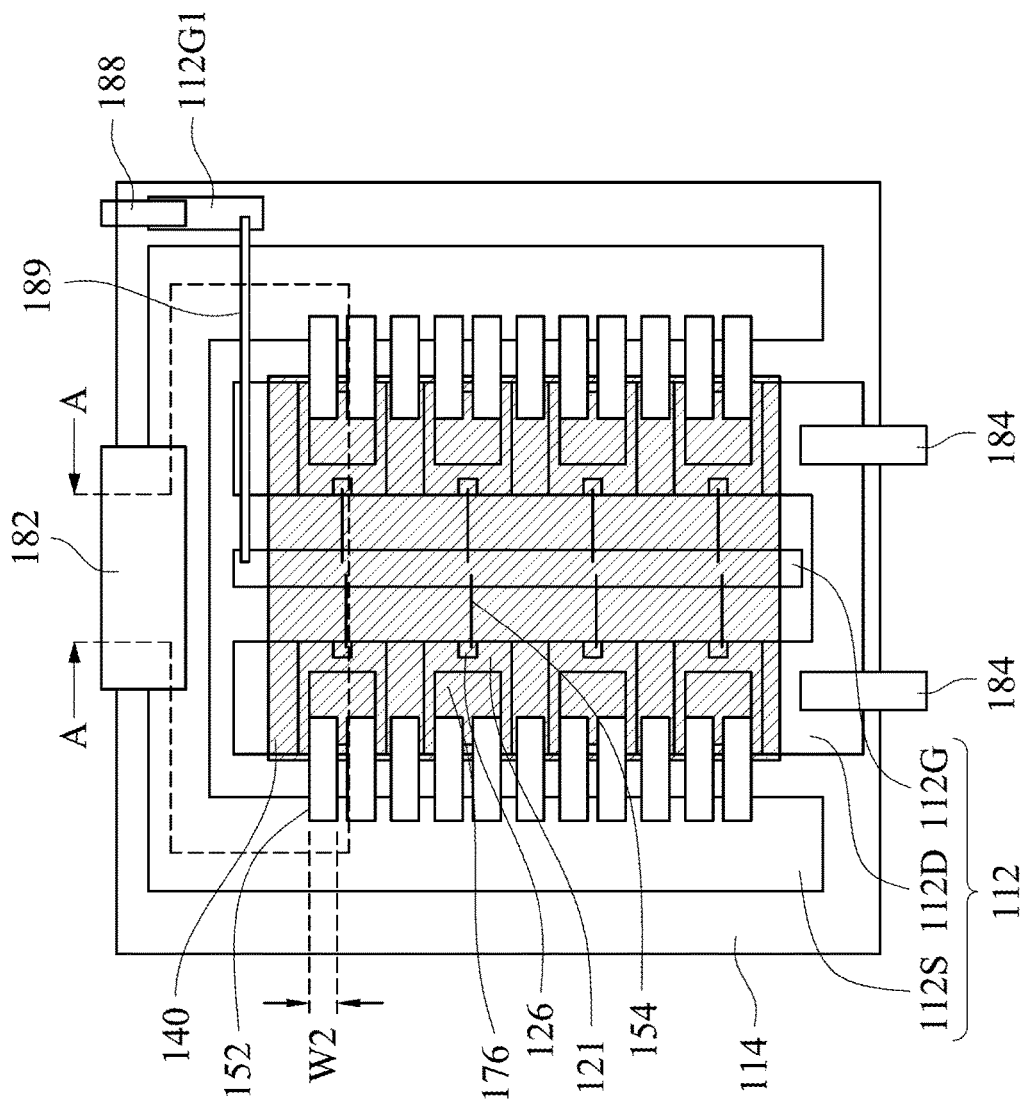
FIG. 7 illustrates a top view of a power module in some other embodiments of the present disclosure.

FIG. 7 illustrates a top view of the power module 100 in some other embodiments of the present disclosure. The power module 100 in FIG. 7 is similar to the power module 100 in FIG. 5. The difference is that the bonding bodies 152 of the power module 100 in FIG. 7 are ribbons, and the width W2 of the ribbons are between 1 millimeter and 2 millimeters.

Figure 8:
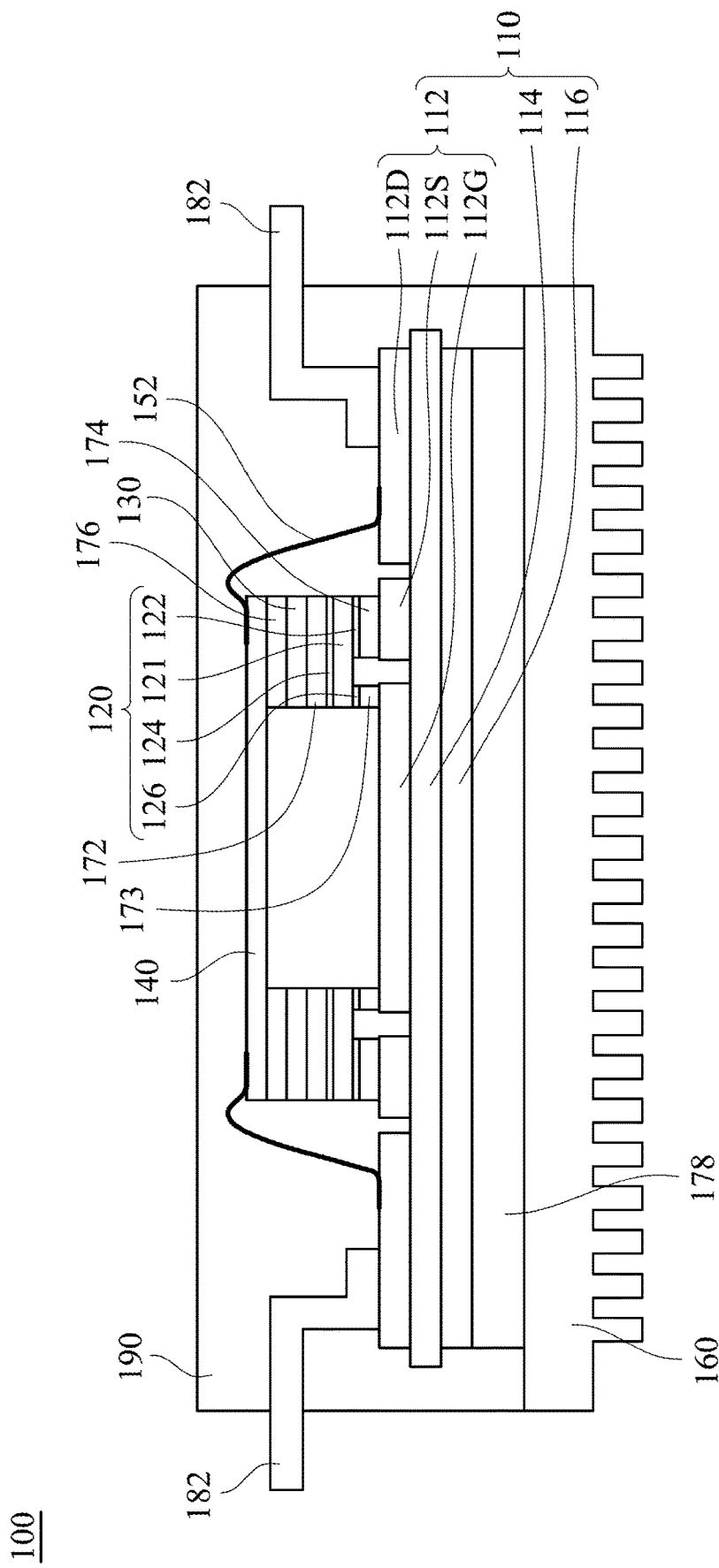
FIG. 8 illustrates a cross-section view of a power module in some other embodiments of the present disclosure.
Figure 9:
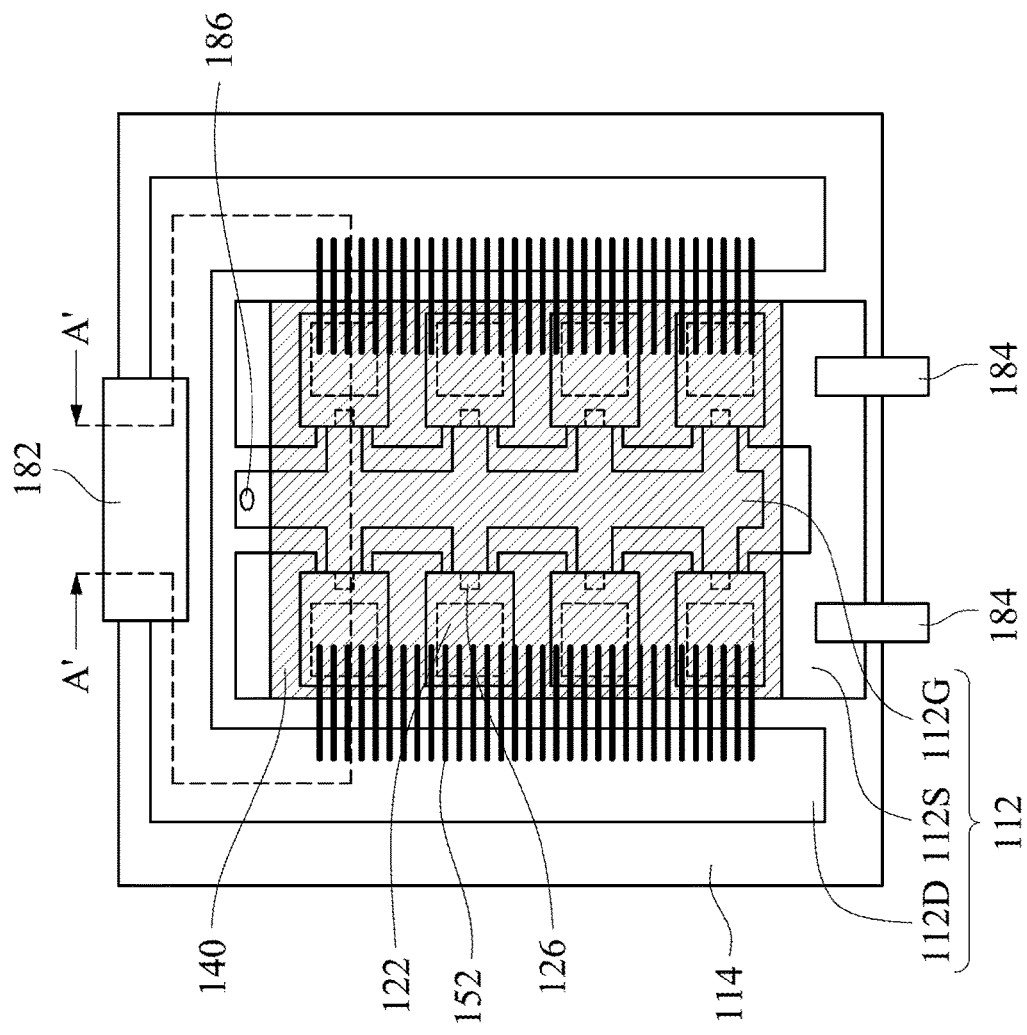
FIG. 9 illustrates a top view of the power module in some other embodiments of the present disclosure.

FIG. 8 illustrates a cross-section view of a power module 100 in some other embodiments of the present disclosure. FIG. 9 illustrates a top view of the power module 100 in some other embodiments of the present disclosure, and FIG. 8 is taken along the cross-section A'-A' in FIG. 9. Referring to FIGS. 8 and 9, the power module 100 in FIG. 8 is similar to the power module 100 in FIG. 1. The difference is that the drains 124 of the chips 120 are placed upwards, and the positions of the drain pattern 112D and source pattern 112S are opposite to those in the power module 100 of FIG. 1. More specifically, in FIG. 8, the drains 124 of the chips 120 face upwards, and the sources 122 and the gates 126 of the chips 120 face downwards. The metallic layer 112 of the power module 100 of FIG. 8 includes the source pattern 112S, the drain pattern 112D and the gate pattern 112G. The chips 120 are disposed on the source pattern 112S, and the source 122 of each of the chips 120 is connected with the source pattern 112S. The drain pattern 112D is adjacent to the source pattern 112S and is spaced apart from the source pattern 112S. The bonding bodies 152 connect the drain pattern 112D and the metal plate 140. The gate pattern 112G is adjacent to the source pattern 112S and is spaced apart from the source pattern 112S, and the gate pattern 112G is connected with the gate 126 of each of the chips 120. The drains 124 of the chips 120 are electrically connected with the drain pattern 112D by the bonding materials 172, the supporting pillars 130 and the metal plate 140, the sources 122 of the chips 120 are electrically connected with the source pattern 112S by the bonding materials 174, and the gates 126 of the chips 120 are electrically connected with the gate pattern 112G by the bonding materials 173. That is, the power module 100 in FIG. 8 does not include the wires 154. The bonding material 173 may be made of conductive materials with lower hardness, such as solder or silver sintering.

Figure 10:
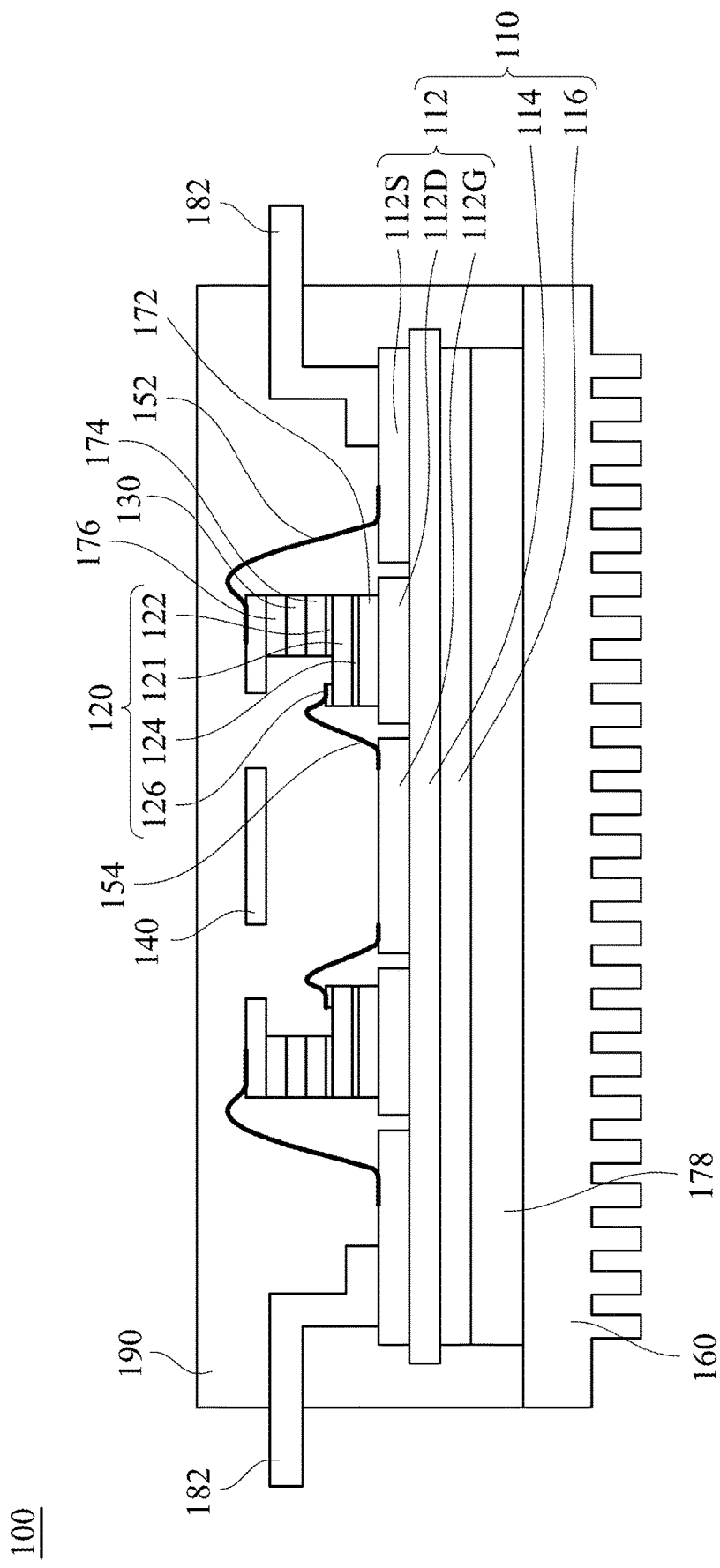
FIG. 10 illustrates a cross-section view of a power module in some other embodiments of the present disclosure.
Figure 11:
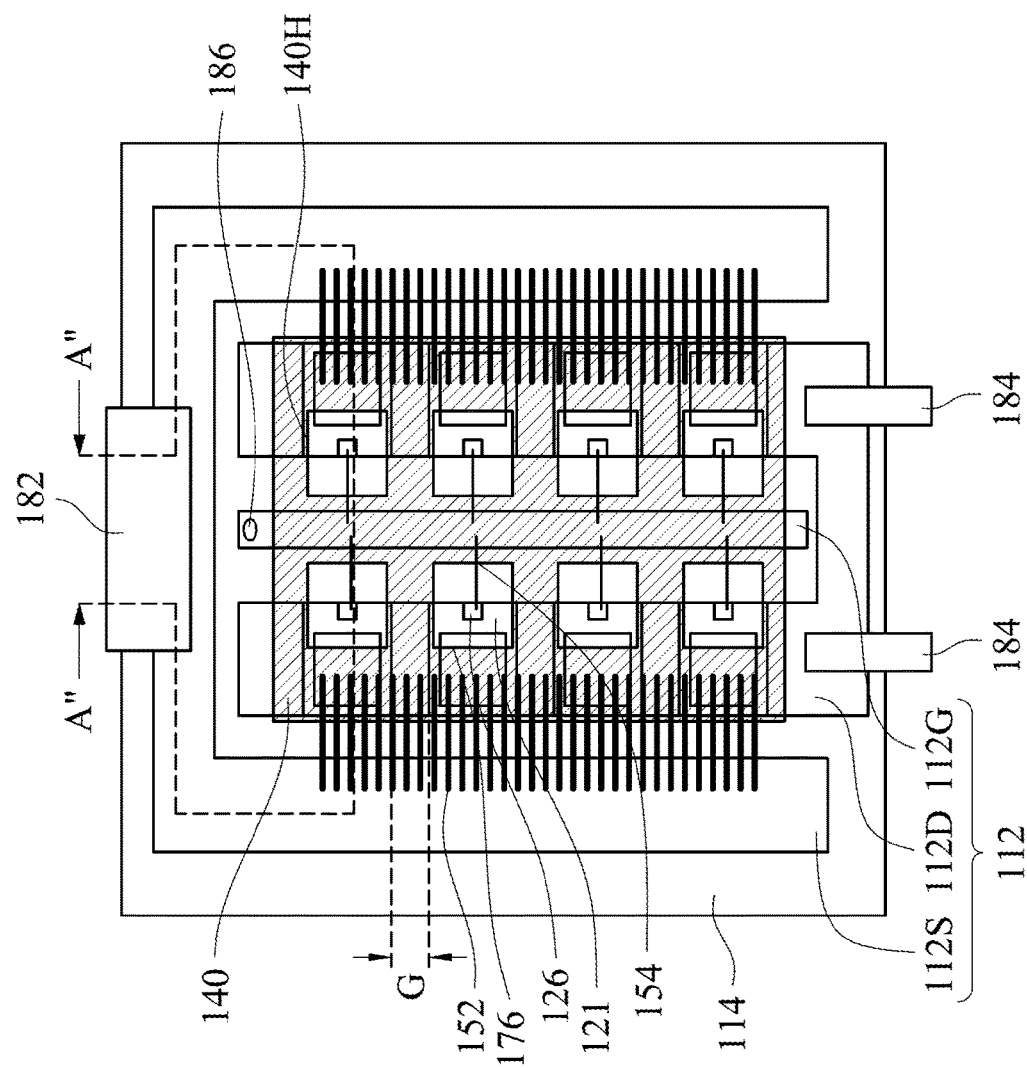
FIG. 11 illustrates a top view of the power module in some other embodiments of the present disclosure.

FIG. 10 illustrates a cross-section view of a power module 100 in some other embodiments of the present disclosure. FIG. 11 illustrates a top view of the power module 100 in some other embodiments of the present disclosure, and FIG. 10 is taken along the cross-section A"-A" in FIG. 11. Referring to FIGS. 10 and 11, the power module 100 in FIG. 10 is similar to the power module 100 in FIG. 1. The difference is that the metal plate 140 in FIG. 10 has a plurality of holes 140H. The holes 140H do not overlap the bonding bodies 152. The holes 140H may be used to reduce the degree of stress and deformation. The locations of the holes 140H may be designed based on the size, the thickness, and the bonding locations of the metal plate 140 and the bonding bodies 152. The metal plate 140 with holes 140H may be applied in all the embodiments of the present disclosure.

Figure 12:
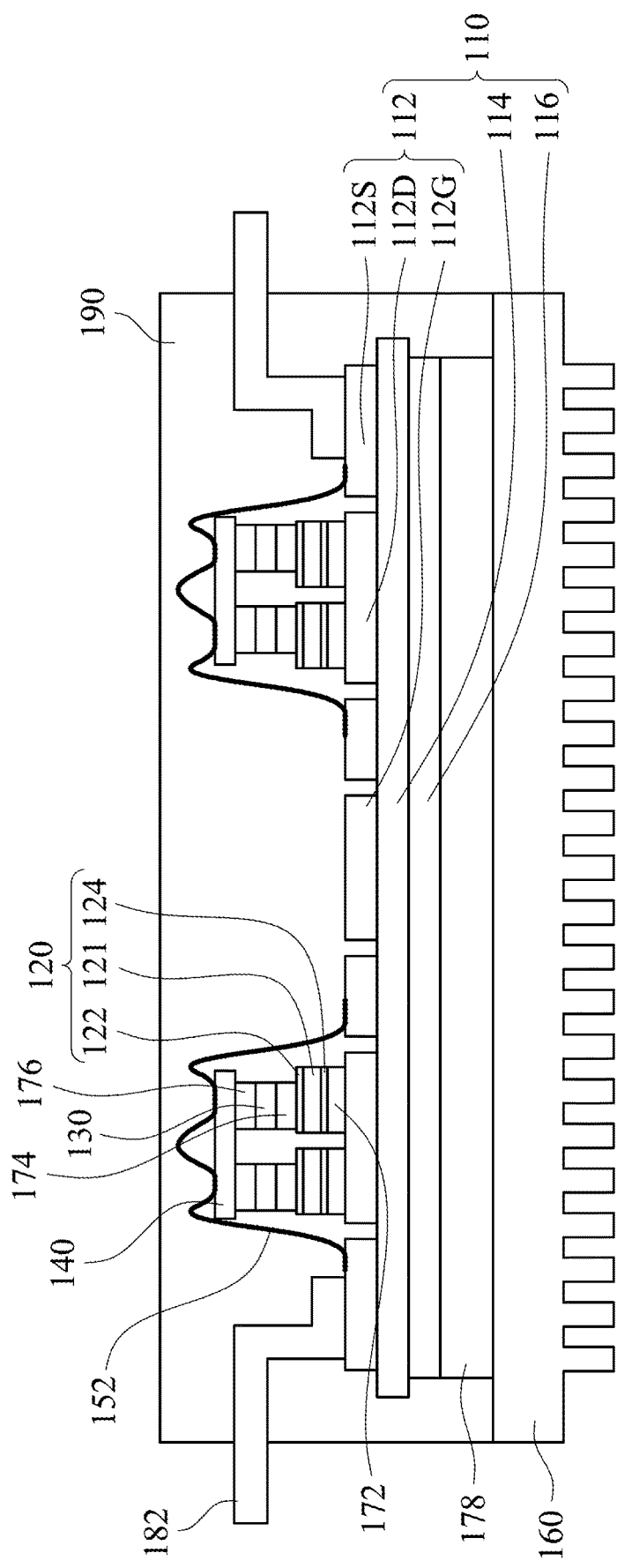
FIG. 12 illustrates a cross-section view of a power module in some other embodiments of the present disclosure.
Figure 13:
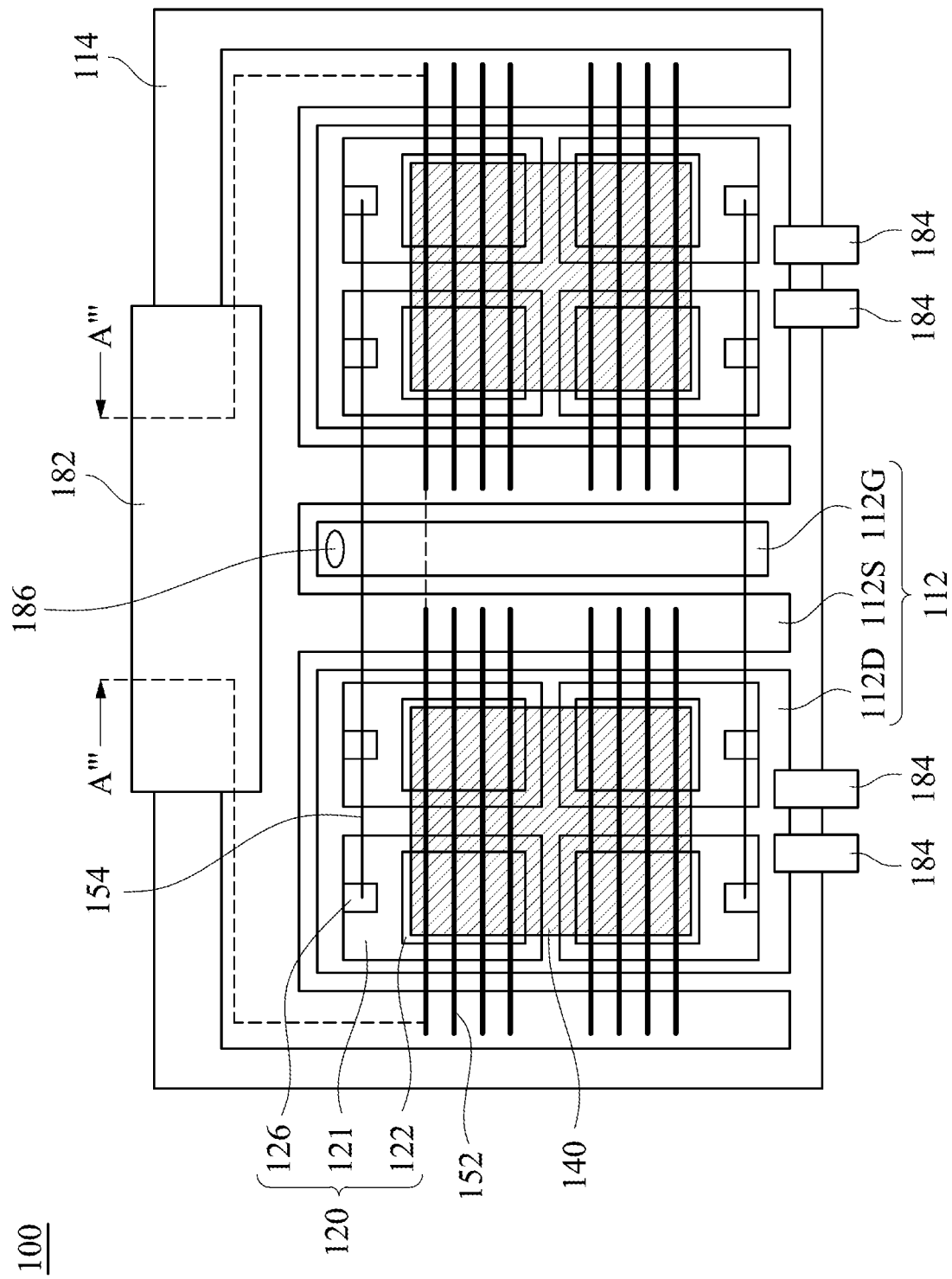
FIG. 13 illustrates a top view of the power module in some other embodiments of the present disclosure.

FIG. 12 illustrates a cross-section view of a power module 100 in some other embodiments of the present disclosure. FIG. 13 illustrates a top view of the power module 100 in some other embodiments of the present disclosure, and FIG. 12 is taken along the cross-section A"-A" in FIG. 13. Referring to FIGS. 12 and 13, the power module 100 in FIG. 12 is similar to the power module 100 in FIGS. 1 and 2. The difference is that the arrangement of the chips 120 and the shape of the metallic layer 112 are different. In FIG. 12, the metallic layer 112 includes the drain pattern 112D, the source pattern 112S and the gate pattern 112G. The source pattern 112S is adjacent to the drain pattern 112D and is spaced apart from the drain pattern 112D. The gate pattern 112G is adjacent to the source pattern 112S and is spaced apart from the source pattern 112S. The drain pattern 112D, the source pattern 112S and the gate pattern 112G may be shown in FIG. 13.

The difference compared to the power module 100 in FIG. 2 is that the source pattern 112S, instead of the drain pattern 112D, is at two sides of the gate pattern 112G of the power module 100 in FIG. 13. The chips 120 are on the drain pattern 112D of the metallic layer 112, and the drains 124 of the chips 120 are electrically connected with the drain pattern 112D of the metallic layer 112. The chips 120 may be arranged into a 2-row array (such as 2x2, 3x2, 4x2, etc.), and the gate 126 in each row is distal from each other. The chips 120 in the same array are connected with the same metal plate 140. The metal plate 140 exposes the gates 126 of the chips 120. The bonding bodies 152 electrically connect the source pattern 112S and the metal plate 140, and the bonding bodies 152 may electrically connect the sources 122 of multiple chips 120 and the source pattern 112S. The gate pattern 112G is electrically connected with the gates 126 of the chips 120. More specifically, the gates 126 of the chips 120 and the gate pattern 112G are electrically connected by the wires 154. The wires 154 also electrically connect the gates 126 of multiple chips 120 with the gate pattern 112G at the same time. When the structure of the power module 100 is shown as FIG. 13, the bonding bodies 152 may be much beneficial to enhance the current uniformity between different chips 120.

Figure 14:
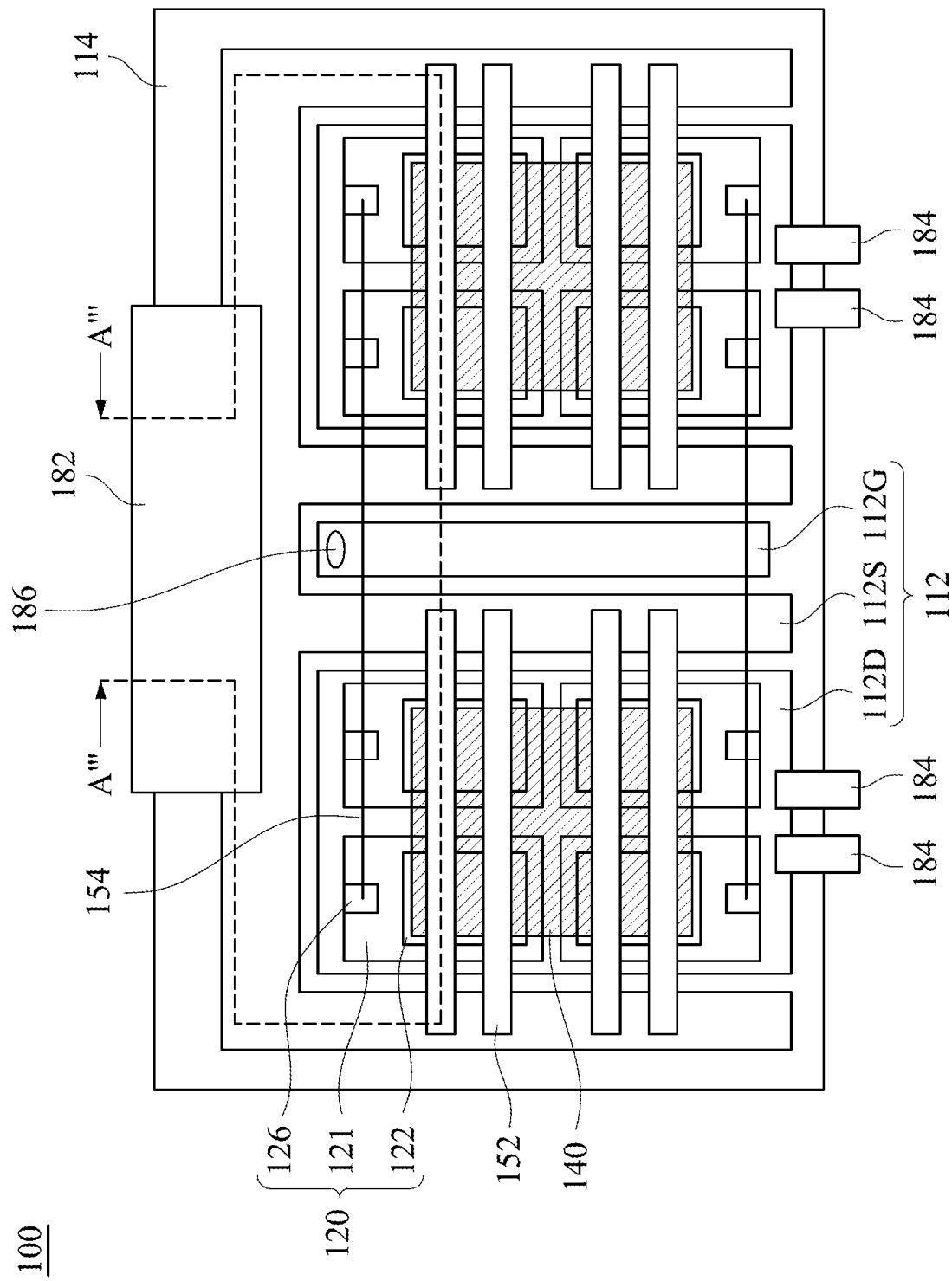
FIG. 14 illustrates a cross-section view of a power module in some other embodiments of the present disclosure.

FIG. 14 illustrates a top view of the power module 100 in some other embodiments of the present disclosure. The power module 100 in FIG. 14 is similar to the power module 100 in FIG. 13. The difference is that the bonding bodies 152 of the power module 100 in FIG. 14 are ribbons. When the bonding bodies 152 are ribbons, the widths of the ribbons are larger and it is more likely to achieve the current uniformity. Moreover, the bonding bodies 152 are directly on the metal plate 140 instead of in contact with the chips 120. Therefore, the widths of the bonding bodies 152 are not limited by the sizes of the chips 120.

Figure 15:
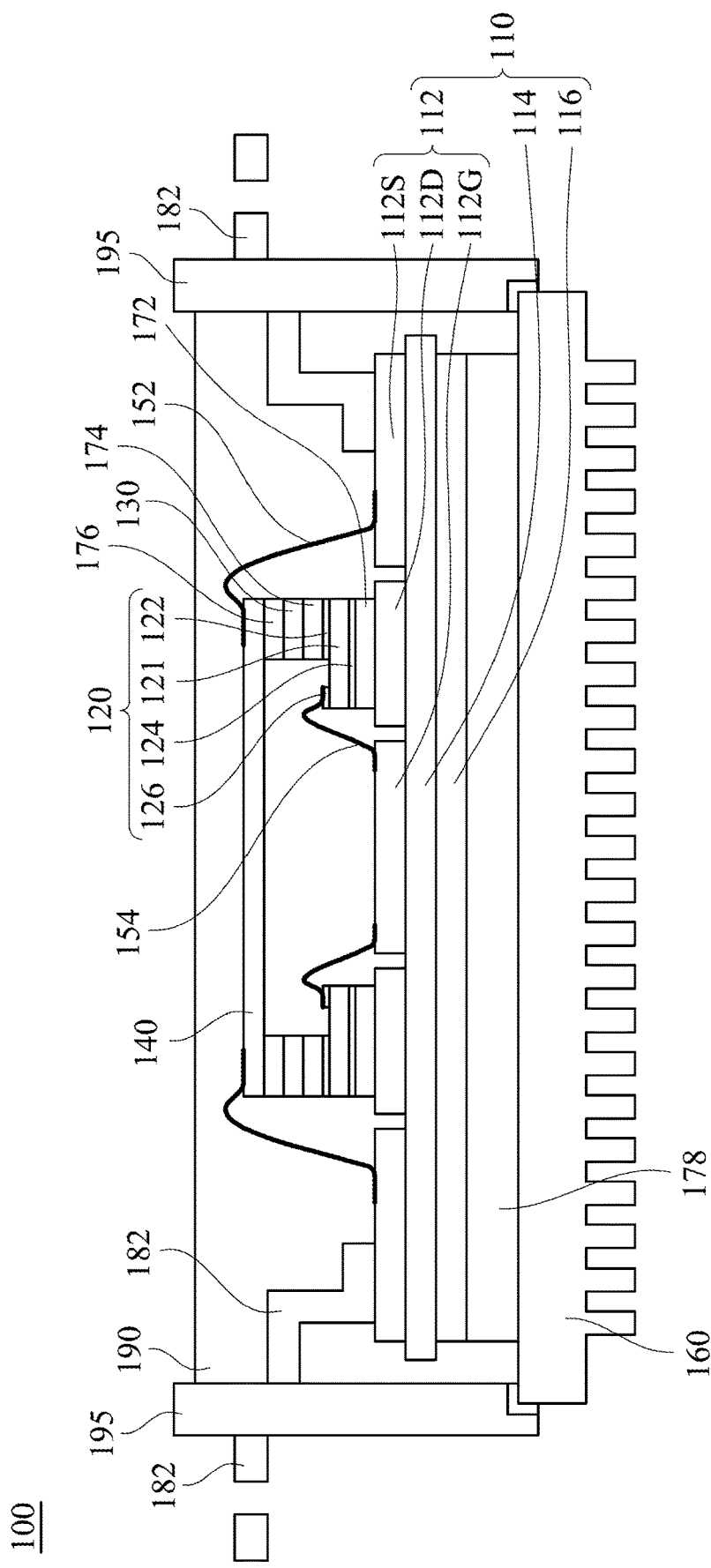
FIG. 15 illustrates a top view of the power module in some other embodiments of the present disclosure.
Figure 16:
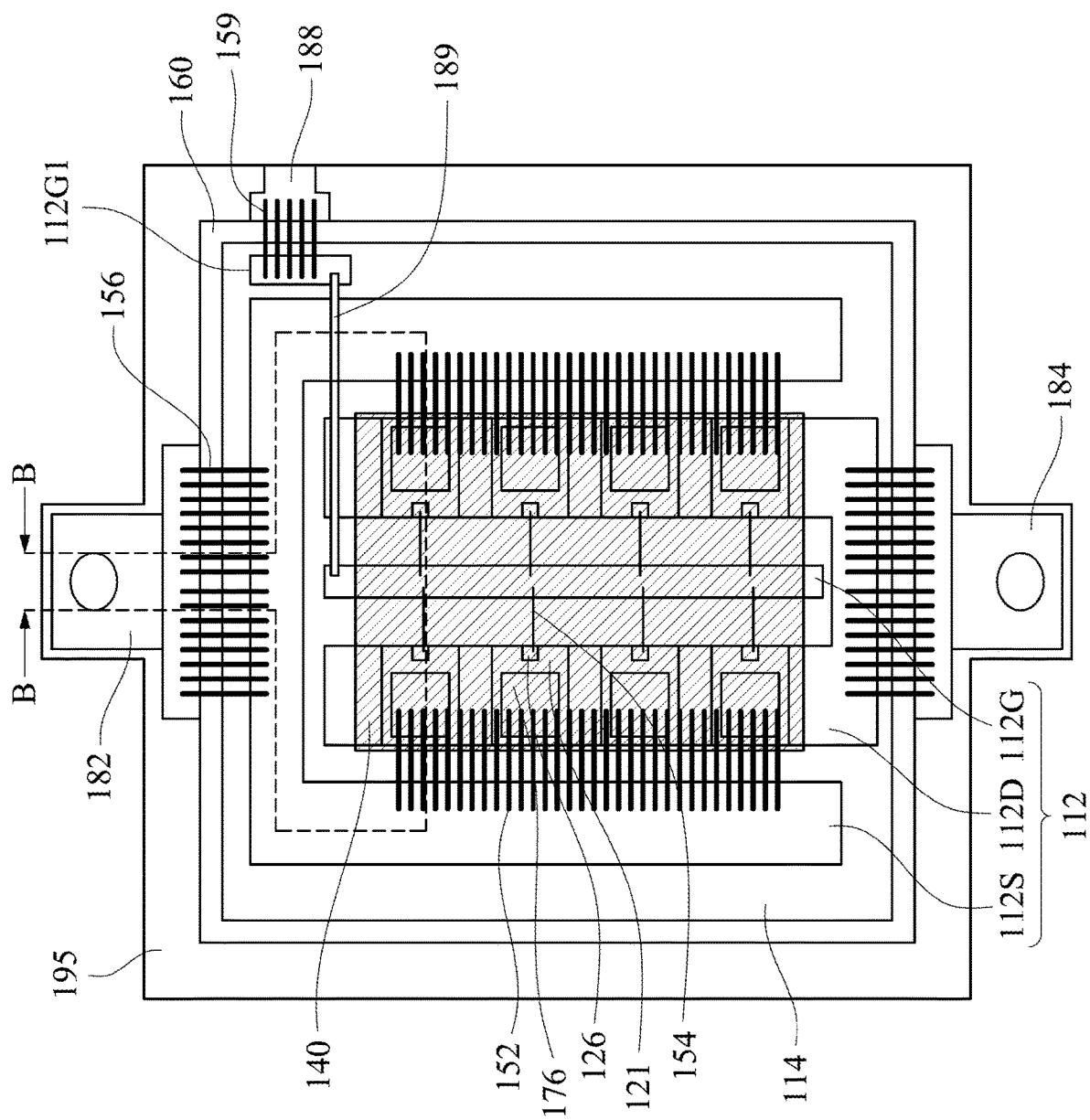
FIG. 16 illustrates a top view of the power module in some other embodiments of the present disclosure.

FIG. 15 illustrates a cross-section view of a power module 100 in some other embodiments of the present disclosure. FIG. 16 illustrates a top view of the power module 100 in some other embodiments of the present disclosure, and FIG. 15 is taken along the cross-section B-B in FIG. 15. Referring to FIGS. 15 and 16, the power module 100 in FIG. 15 is similar to the power module 100 in FIG. 1. The difference is that the power module 100 in FIG. 15 further includes a housing 195. The housing 195 surrounds the baseplate 160, and the first terminal 182 and the second terminal 184 are on the housing 195. The first terminal 182 and the source pattern 112S are electrically connected by the wires 156, and the second terminal 184 and the drain pattern 112D are electrically connected by the wires 158. Moreover, the power module 100 in FIG. 15 includes a fourth terminal 188 and a gate pattern 112G. The fourth terminal 188 is on the housing 195. The fourth terminal 188 is electrically connected with the gate pattern 112G1 by the wires 159. The fourth terminal 188 and the gate pattern 112G are electrically connected by a bridge 189. The bridge 189 is conductive and only in contact with the gate pattern 112G and the gate pattern 112G1. Therefore, the fourth terminal 188 does not electrically connect the source pattern 112S and the drain pattern 112D. It is noted that the bridge 189 is omitted in FIG. 15 for simplicity. A voltage may be provided from the fourth terminal 188 to the gates 126 of the chips 120 to turn on the chips in the power module 100. The sources 122 and the drains 124 of the chips have a potential difference, so the current flows from the second terminal 184 through the drain pattern 112D, the drains 124 of the chips 120, the sources 122 of the chips 120, the supporting pillars 130, the metal plate 140, the bonding bodies 152, the source pattern 112S to the first terminal 182.

Figure 17:
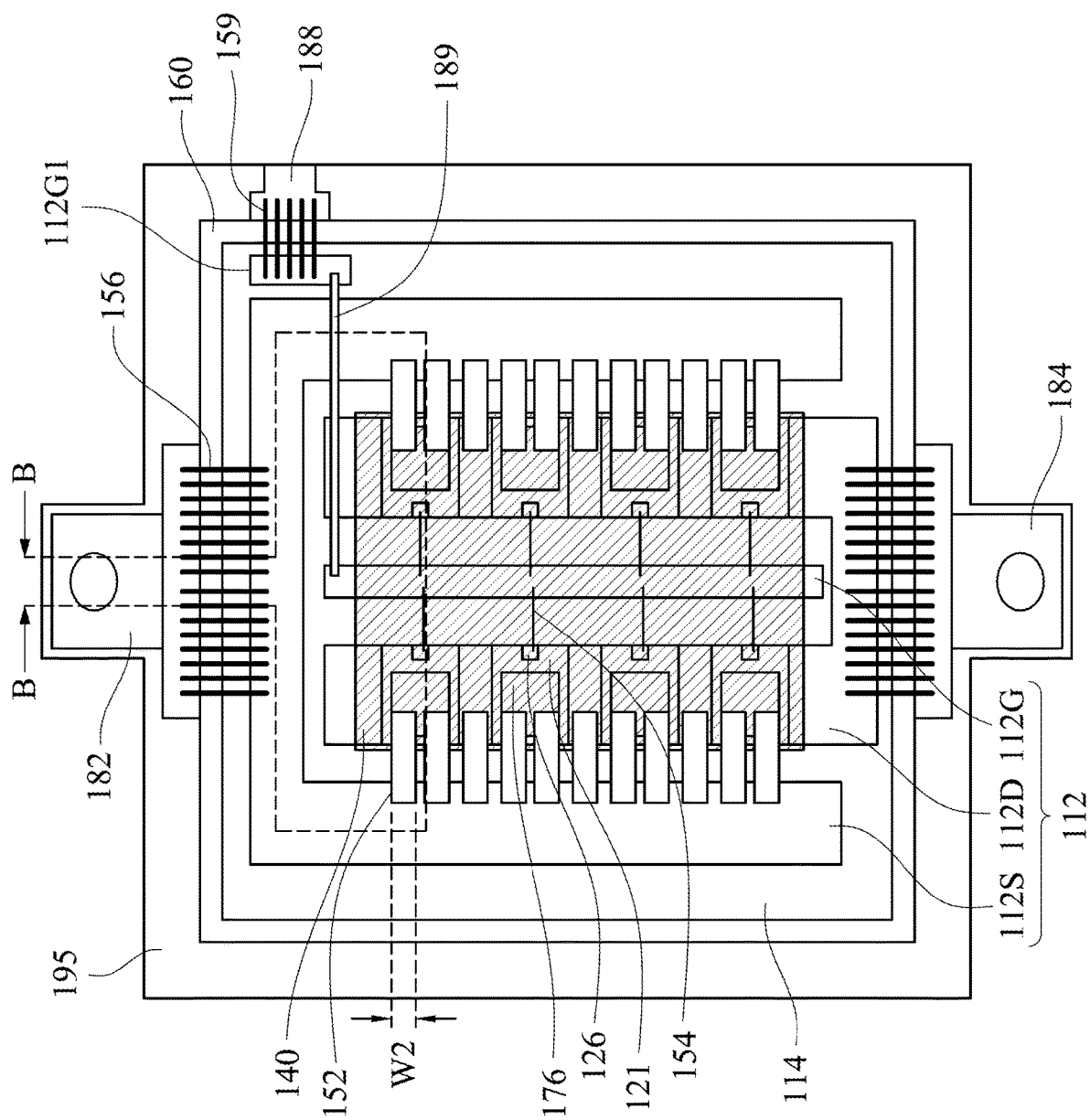
FIG. 17 illustrates a top view of the power module in some other embodiments of the present disclosure.

FIG. 17 illustrates a top view of the power module 100 in some other embodiments of the present disclosure. The power module 100 in FIG. 17 is similar to the power module 100 in FIG. 16. The difference is that the bonding bodies 152 of the power module 100 in FIG. 17 are ribbons, and the widths of the ribbons are between 1 millimeter and 2 millimeters.

Figure 18:
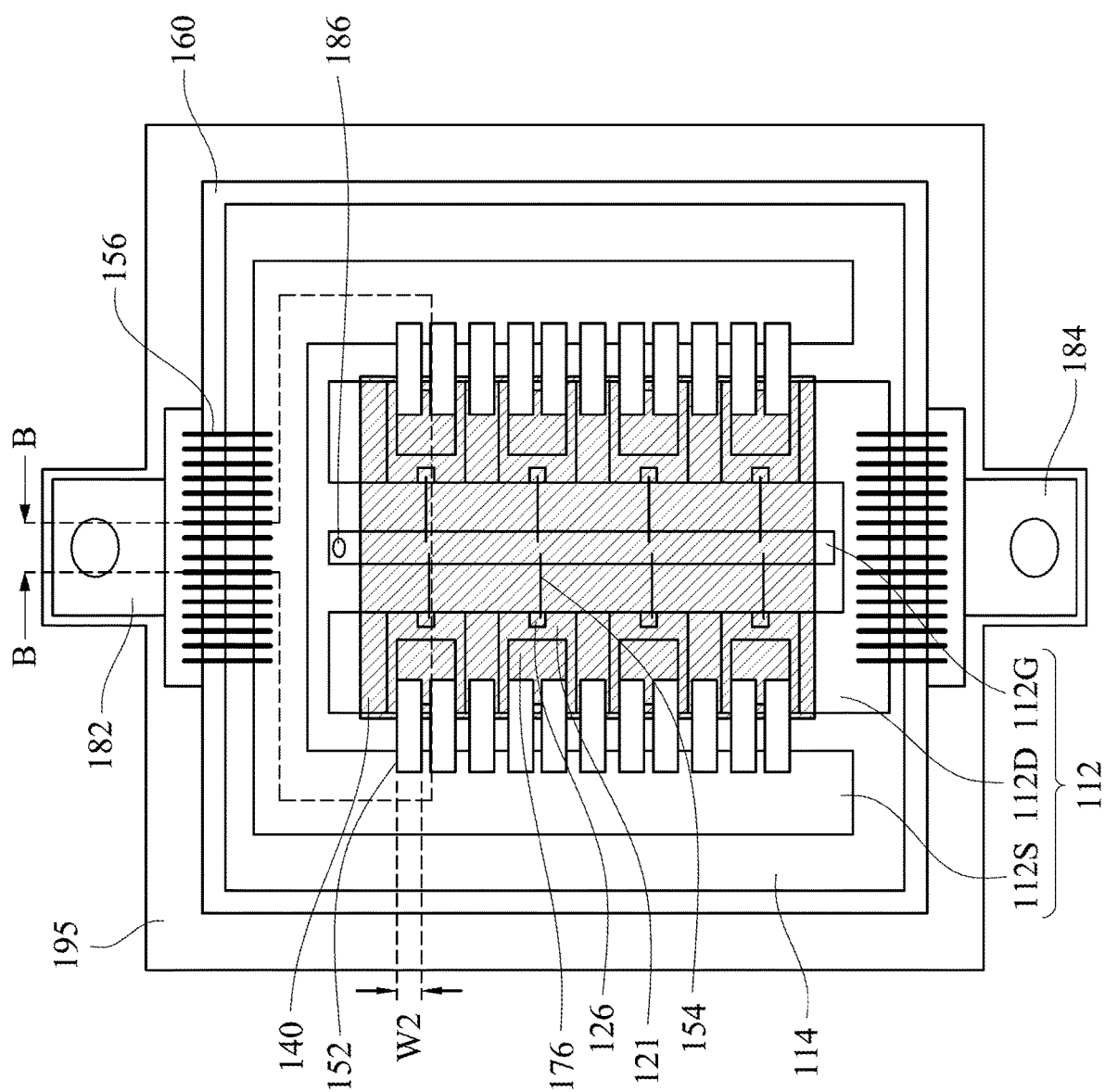
FIG. 18 illustrates a top view of the power module in some other embodiments of the present disclosure.

FIG. 18 illustrates a top view of the power module 100 in some other embodiments of the present disclosure. The power module 100 in FIG. 18 is similar to the power module 100 in FIG. 17. The difference is that the power module 100 in FIG. 18 may include pin-shaped third terminal 186.

Table 1 illustrates the bonding strength of bonding bodies at different locations, and the bonding bodies are aluminum wires with wire diameters of 380 μm. Referring to FIG. 2 and table 1, specifically, when the bonding bodies 152 are over the chips 120, or the bonding bodies 152 are over the gap G between the chips 120, the difference of pushing force values of removing the bonding bodies 152 from the surface of the metal plate 140 is not significant. The removal method of the bonding bodies 152 is pushing away the bonding bodies 152 by a pushing force in a horizontal direction from the bonding locations of the bonding bodies 152 and the metal plate 140. That is, the maximum pushing force values which the bonding bodies 152 over the chips 120 and the bonding bodies 152 over the gap G between the chips 120 can withstand are close. Moreover, no matter the bonding bodies 152 over the chips 120 or the bonding bodies 152 over the gap G between the chips 120, when the bonding bodies 152 are removed, the remaining portion of the materials at the bonding locations are all greater than 80% of original materials, which means that the strength of the materials at the bonding locations are strong enough, so that the materials at the bonding locations still remain at the bonding locations on the metal plate 140 after removal of the bonding bodies 152. Therefore, no matter the bonding bodies 152 over the chips 120 or the bonding bodies 152 over the gap G between the chips 120, the strength of the materials at the bonding locations are close.

TABLE 1

| the maximum pushing force values to remove the bonding bodies over the chips (kgf) | the maximum pushing force values to remove the bonding bodies over the gap (kgf) | remaining portion of the material over the chips | remaining portion of the material over the gap |
| --- | --- | --- | --- |
| 1.832 | 1.811 | >80% | >80% |
| 1.808 | 1.829 | >80% | >80% |
| 1.664 | 1.828 | >80% | >80% |
| 1.746 | 1.863 | >80% | >80% |
| 1.731 | 1.736 | >80% | >80% |
| 1.747 | 1.751 | >80% | >80% |
| 1.786 | 1.775 | >80% | >80% |
| 1.836 | 1.745 | >80% | >80% |
| 1.692 | 1.765 | >80% | >80% |

TABLE 1-continued

| the maximum pushing force values to remove the bonding bodies over the chips (kgf) | the maximum pushing force values to remove the bonding bodies over the gap (kgf) | remaining portion of the material over the chips | remaining portion of the material over the gap |
| --- | --- | --- | --- |
| 1.736 | 1.828 | >80% | >80% |
| 1.700 | 1.751 | >80% | >80% |
| 1.774 | 1.818 | >80% | >80% |
| average: 1.754 | average: 1.792 | average: >80% | average: >80% |

Figure 19:
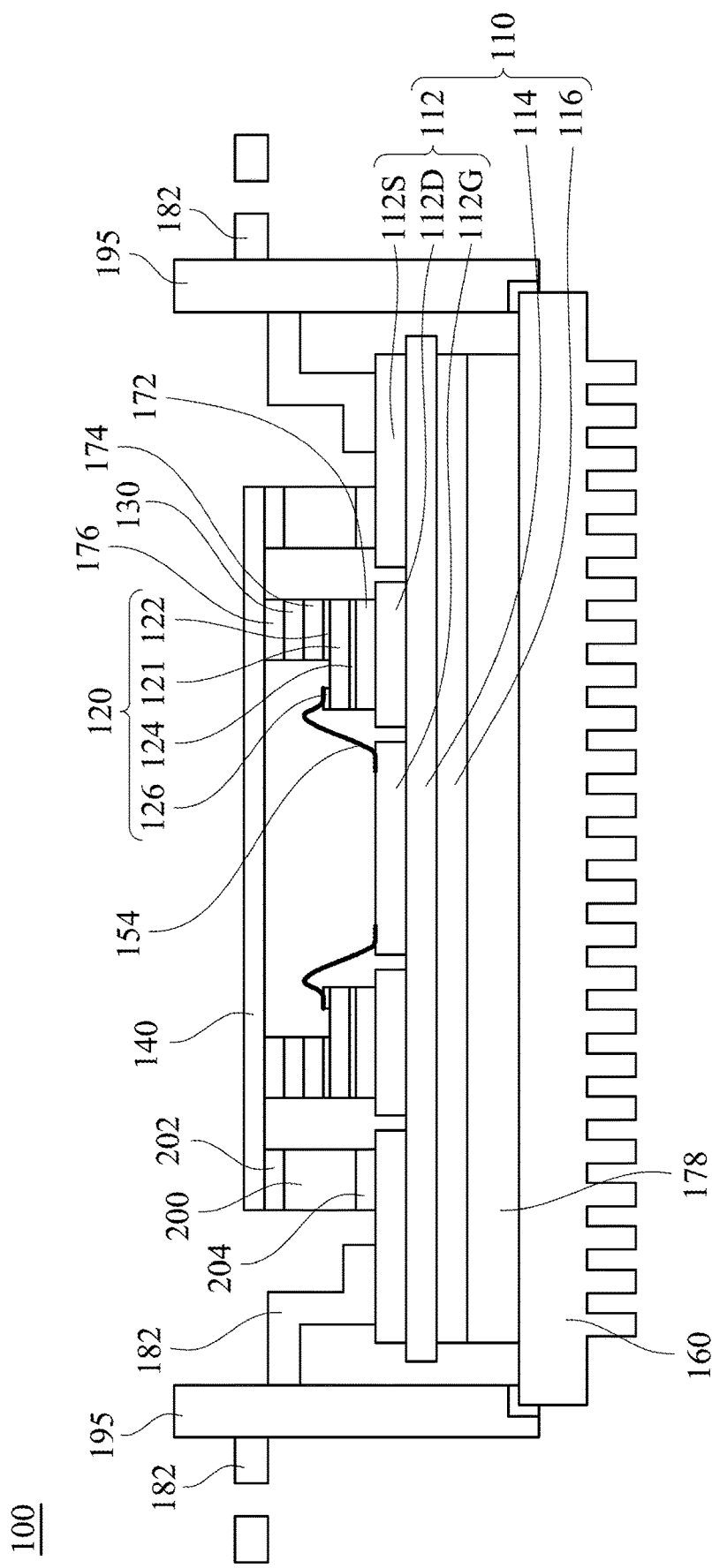
FIG. 19 illustrates a cross-section view of a power module in some other embodiments of the present disclosure.
Figure 20:
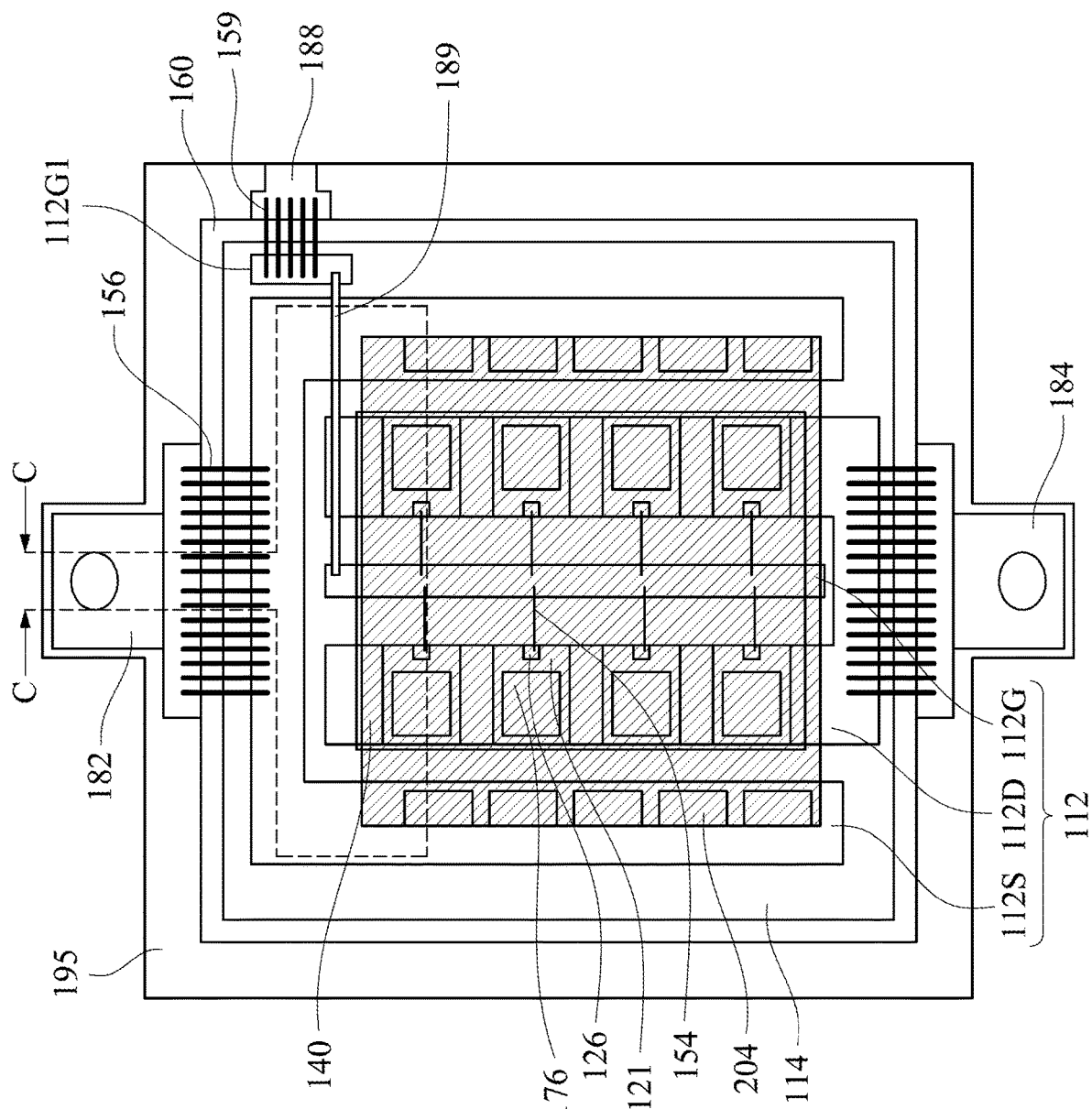
FIG. 20 illustrates a top view of the power module in some other embodiments of the present disclosure.

FIG. 19 illustrates a cross-section view of a power module 100 in some other embodiments of the present disclosure. FIG. 20 illustrates a top view of the power module 100 in some other embodiments of the present disclosure, and FIG. 19 is taken along the cross-section C-C in FIG. 20. Referring to FIGS. 19 and 20, the power module 100 in FIG. 19 is similar to the power module 100 in FIG. 2. The difference is that the power module 100 in FIG. 19 includes bonding materials, and the bonding materials include metal pillars 200 and bonding materials 202 and 204. The metal pillars 200 connect the metal plate 140 and the metallic layer 112. In some embodiments, the metal plate 140 extends to the source pattern 112S of the metallic layer 112, the bonding materials 202 electrically connect the metal plate 140 and the metal pillars 200, and the bonding materials 204 electrically connect the source pattern 112S and the metal pillars 200.

Figure 21:
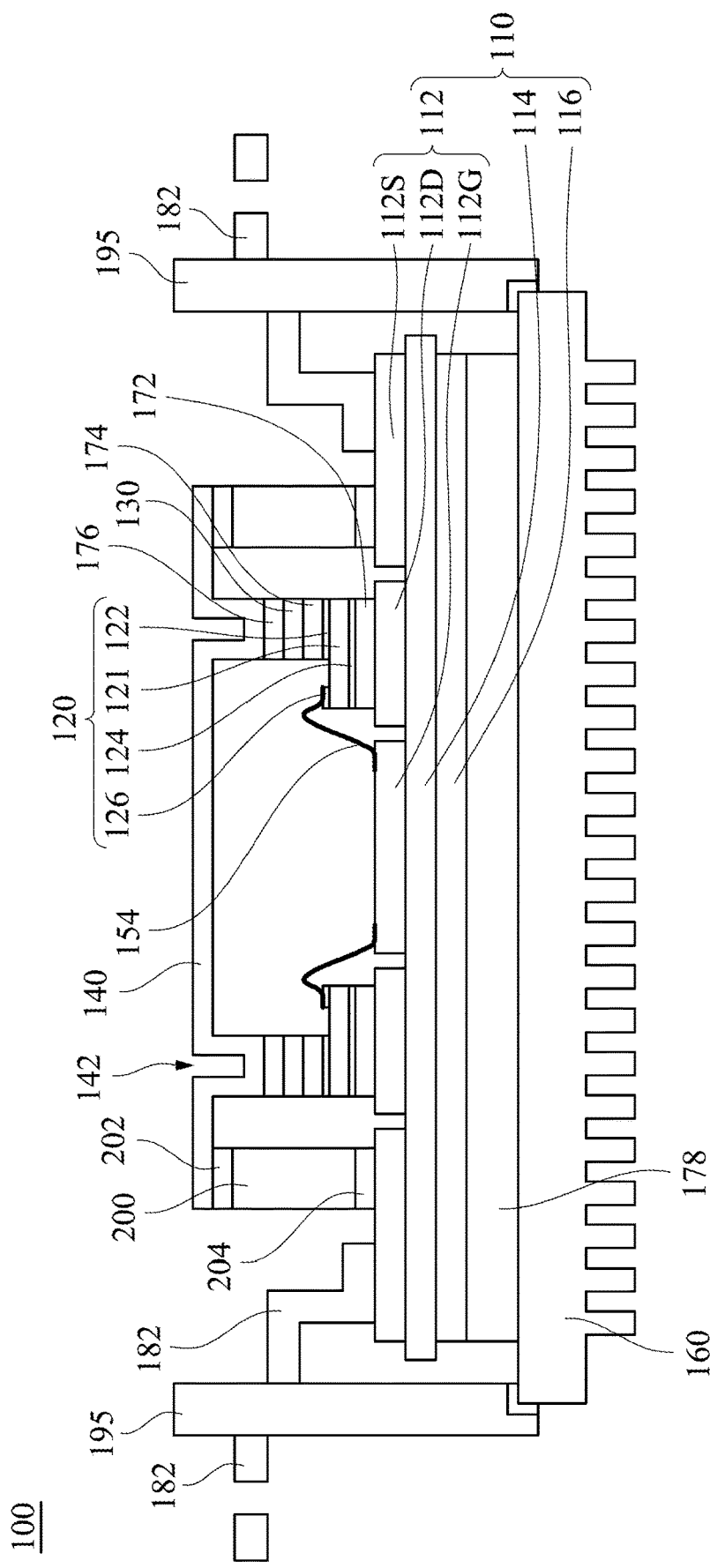
FIG. 21 illustrates a cross-section view of a power module in some other embodiments of the present disclosure.

FIG. 21 illustrates a cross-section view of a power module 100 in some other embodiments of the present disclosure. The power module 100 in FIG. 21 is similar to the power module 100 in FIG. 19. The difference is that the metal plate 140 of the power module 100 in FIG. 21 further includes recess structures 142 on the supporting pillars 130. The recess structures 142 may be used to reduce the thermal stress due to thermal expansion and contraction. For example, when the chips 120 of the power module 100 are in operation thereby dissipating heat, the recess structures 142 may provide room for thermal expansion and contraction, so that the thermal stress of the metal plate 140 is reduced.

Figure 22:
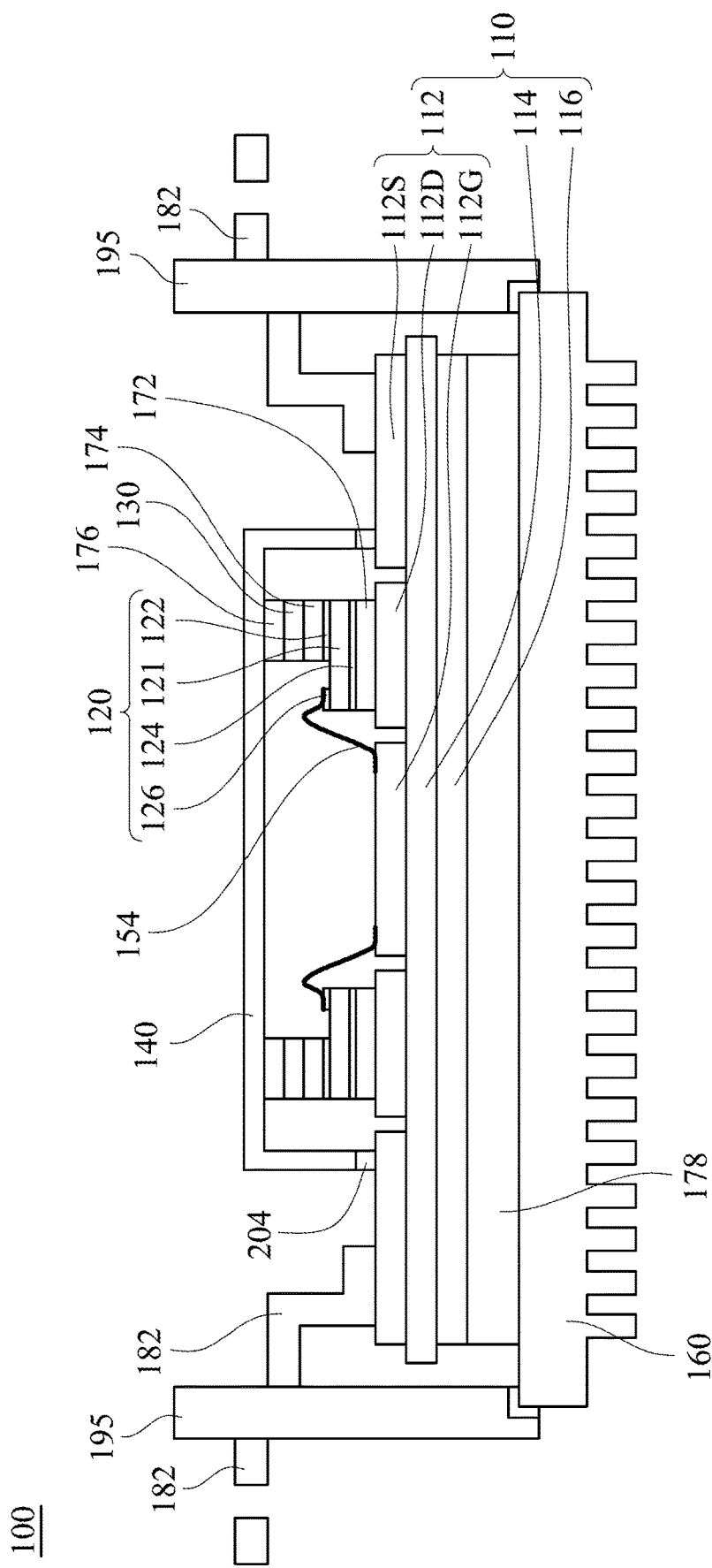
FIG. 22 illustrates a cross-section view of a power module in some other embodiments of the present disclosure.
Figure 23:
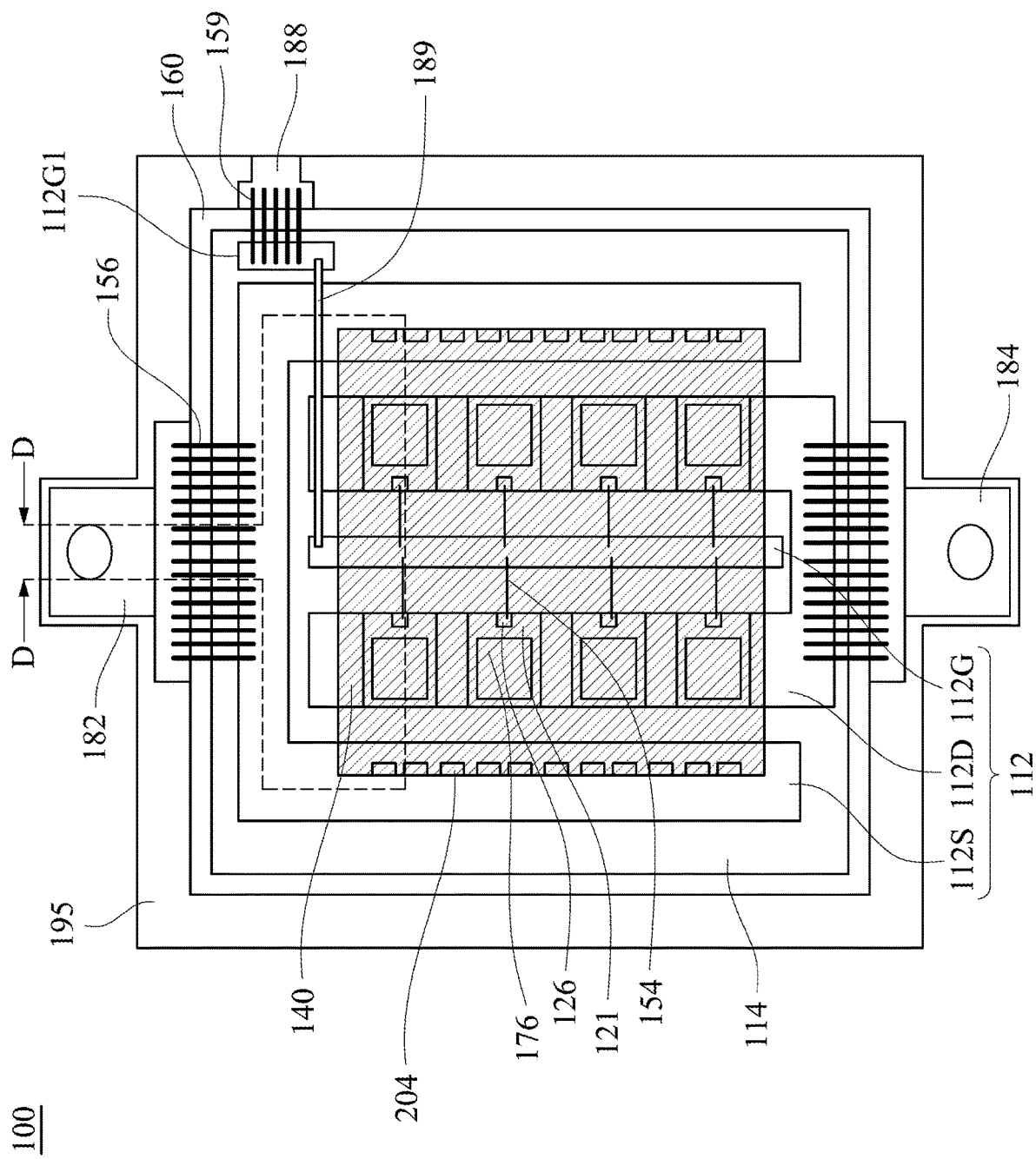
FIG. 23 illustrates a top view of the power module in some other embodiments of the present disclosure.

FIG. 22 illustrates a cross-section view of a power module 100 in some other embodiments of the present disclosure. FIG. 23 illustrates a top view of the power module 100 in some other embodiments of the present disclosure, and FIG. 22 is taken along the cross-section D-D in FIG. 23. Referring to FIGS. 22 and 23, the power module 100 in FIG. 23 is similar to the power module 100 in FIG. 19. The difference is that the metal pillars 200 and the bonding materials 202 are removed in the power module 100 in FIG. 22, and the bonding materials 204 serve as the bonding bodies to connect the metal plate 140 and the metallic layer 112. The metal plate 140 is bent towards the metallic layer 112, and the bonding materials 204 directly connect the metal plate 140 and the metallic layer 112.

Figure 24:
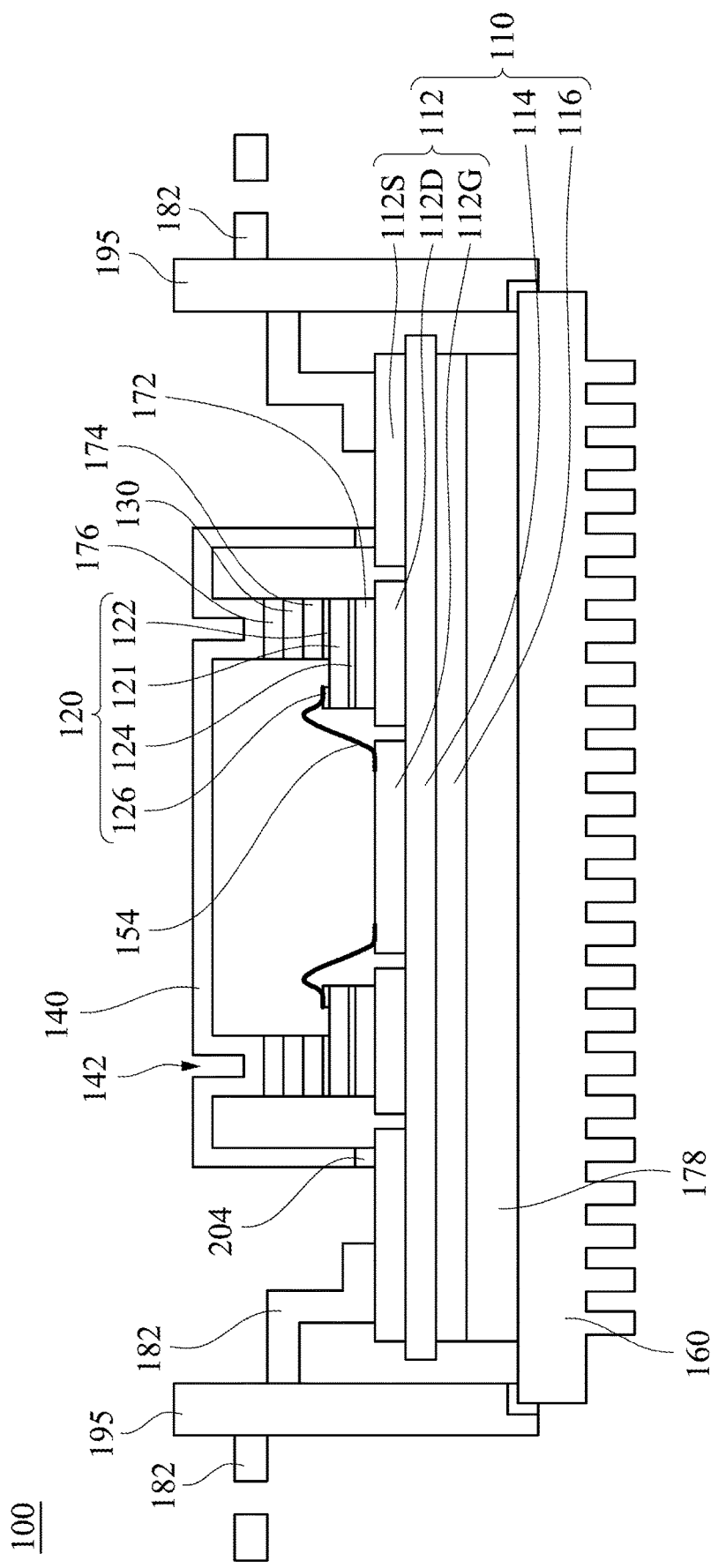
FIG. 24 illustrates a cross-section view of a power module in some other embodiments of the present disclosure.

FIG. 24 illustrates a cross-section view of a power module 100 in some other embodiments of the present disclosure. The power module 100 in FIG. 24 is similar to the power module 100 in FIG. 22. The difference is that the metal plate 140 of the power module 100 in FIG. 24 further includes recess structures 142 on the supporting pillars 130. The recess structures 142 may be used to reduce the thermal stress due to thermal expansion and contraction. For example, when the chips 120 of the power module 100 are in operation and dissipate heat, the recess structures 142 may provide room for thermal expansion and contraction, so that the thermal stress of the metal plate 140 is reduced.

Figure 25:
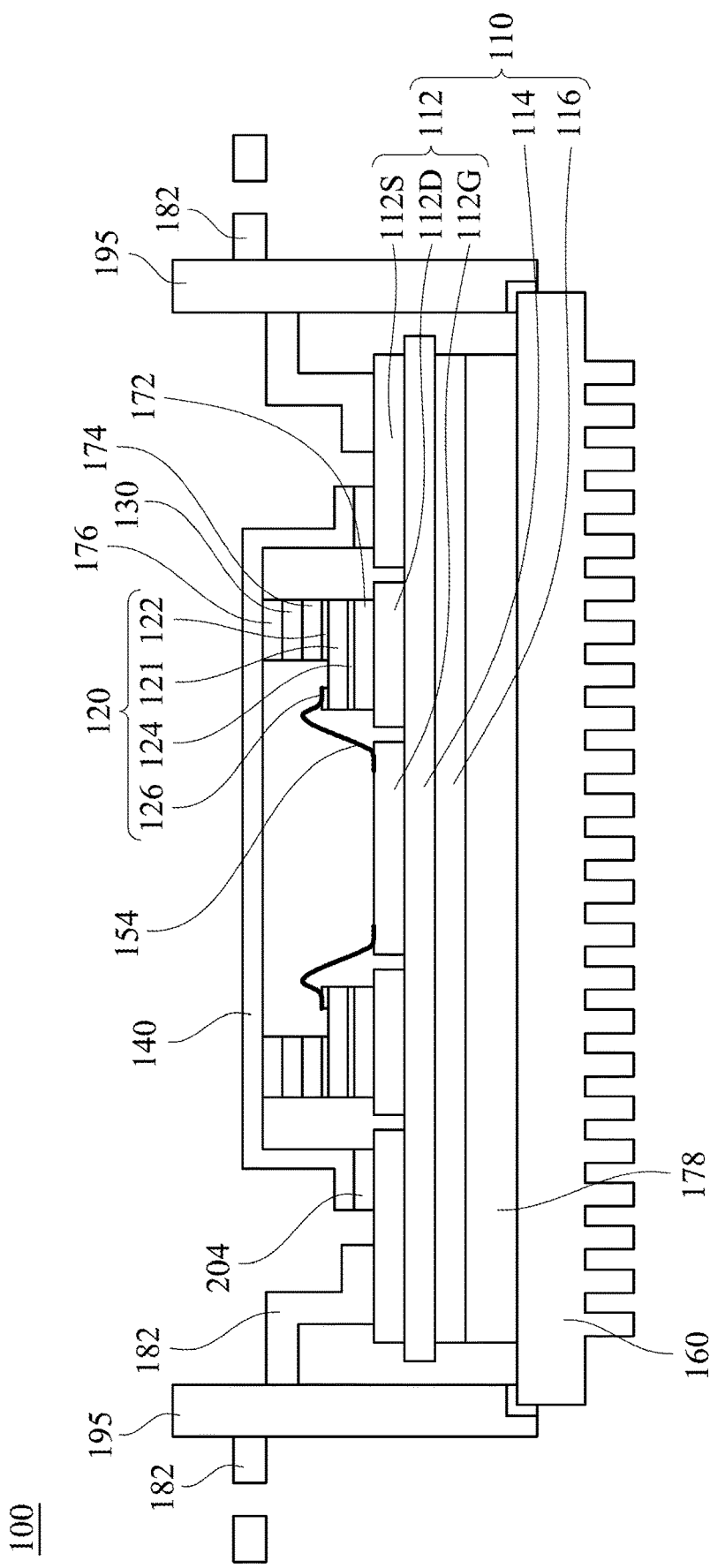
FIG. 25 illustrates a cross-section view of a power module in some other embodiments of the present disclosure.

FIG. 25 illustrates a cross-section view of a power module 100 in some other embodiments of the present disclosure. The power module 100 in FIG. 25 is similar to the power module 100 in FIG. 22. The difference is that the metal plate 140 of the power module 100 in FIG. 25 is bended towards the metallic layer 112, and the bending portion of the metal plate 140 extends along the metallic layer 112.

Figure 26:
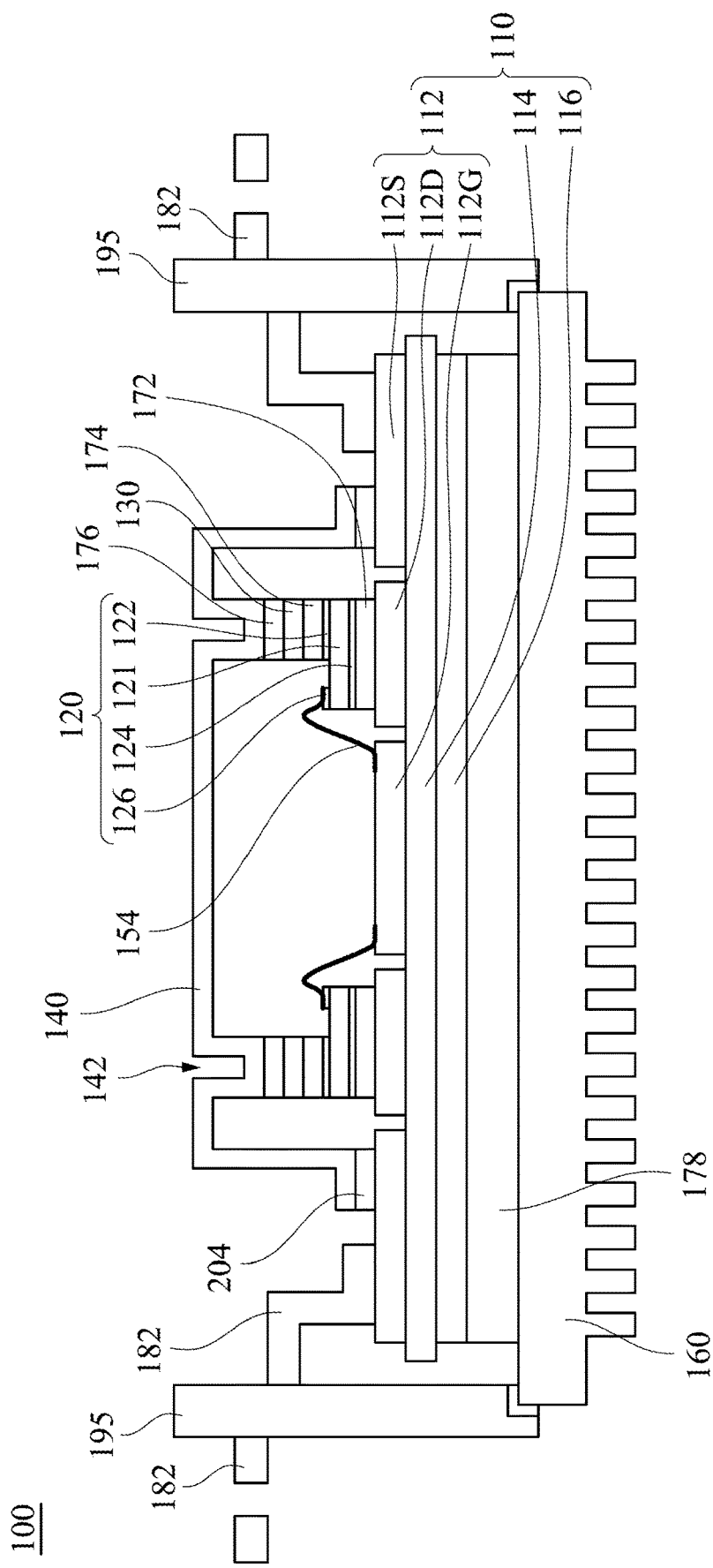
FIG. 26 illustrates a cross-section view of a power module in some other embodiments of the present disclosure.

FIG. 26 illustrates a cross-section view of a power module 100 in some other embodiments of the present disclosure. The power module 100 in FIG. 26 is similar to the power module 100 in FIG. 25. The difference is that the metal plate 140 of the power module 100 in FIG. 26 further includes recess structures 142 on the supporting pillars 130. The recess structures 142 may be used to reduce the thermal stress due to thermal expansion and contraction. For example, when the chips 120 of the power module 100 are in operation and dissipate heat, the recess structures 142 may provide room for thermal expansion and contraction, so that the thermal stress of the metal plate 140 is reduced.

As mentioned above, the power modules of the present disclosure have advantages such as low stress accumulation, high reliability, high current uniformity and high heat dissipation. Specifically, the supporting pillars and the bonding materials may serve as cushions to reduce the stress accumulated between the bonding materials and the chips. The metal plate does not extend to the metallic layer and bonds to the metallic layer, so that the issue, which results from mismatch between the coefficient of thermal expansion of the materials due to increasing and decreasing temperature during the bonding process (such as solder or aluminum sintering process), and the thermal stress accumulation issue are relatively small. The bonding bodies may be densely distributed on the metal plate. As such, the current to the sources of the chips may be shared to every bonding body evenly to achieve current uniformity. When the chips are in operation, the dissipation heat may go up along the supporting pillar and diffuse through the metal plate. Since the heat transferred upwards is partially dissipated from the metal plate, less heat is transferred to the bonding bodies. The thermal stress is not likely to accumulate in the bonding bodies. As such, the reliability of the power modules is enhanced.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A power module, comprising:
a substrate comprising a metallic layer;
a plurality of chips on the metallic layer of the substrate, wherein each of the chips comprises a source, a gate, and a drain;
a plurality of supporting pillars on the chips;
a metal plate on the supporting pillars and connected with the supporting pillars; and
a plurality of bonding bodies connecting the metal plate and the metallic layer.

2. The power module of claim 1, wherein a gap is between the chips, and the bonding bodies are on the metal plate and right above the chips and the gap.

3. The power module of claim 1, wherein the bonding bodies are a plurality of wires or ribbons.

4. The power module of claim 1, wherein the supporting pillar is connected with the source of one of the chips and the metal plate.

5. The power module of claim 1, further comprising a plurality of wires on the chips and connected with the metallic layer, wherein the metallic layer comprises:
a drain pattern, wherein the chips are disposed on the drain pattern, and the drain of the chip is connected with the drain pattern;
a source pattern adjacent to the drain pattern and is spaced apart from the drain pattern, wherein the bonding bodies connect the source pattern and the metal plate; and
a gate pattern adjacent to the drain pattern and is spaced apart from the drain pattern, wherein the wire is connected with the gate pattern and the gate of the chips.

6. The power module of claim 5, further comprising:
a first terminal connected with the source pattern;
a second terminal connected with the drain pattern; and
a fourth terminal connected with the gate pattern.

7. The power module of claim 1, wherein the metallic layer comprises:
a source pattern, wherein the chips are disposed on the source pattern, and the source of the chip is connected with the source pattern;
a drain pattern adjacent to the source pattern and is spaced apart from the source pattern, wherein the bonding bodies connect the drain pattern and the metal plate; and
a gate pattern adjacent to the source pattern and is spaced apart from the source pattern, wherein the gate pattern is connected with the gate of the chip.

8. The power module of claim 1, wherein the bonding bodies are a plurality of metal pillars or bonding materials.

9. The power module of claim 1, wherein the metal plate comprises a recess structure on the supporting pillars.

10. The power module of claim 1, wherein the metal plate bends toward the metallic layer, and a bending portion of the metal plate extends along the metallic layer.

11. A power module, comprising:
a substrate comprising a metallic layer;
a plurality of chips on the metallic layer of the substrate, wherein each of the chips comprises a source, a gate, and a drain;
a plurality of supporting pillars on the chips;
a metal plate on the supporting pillars and connected with the supporting pillars, wherein the metal plate has a plurality of holes; and
a plurality of bonding bodies connecting the metal plate and the metallic layer, wherein the holes of the metal plate do not overlap the bonding bodies.

12. The power module of claim 11, wherein the bonding body is electrically connected with the source of chip and the metallic layer.

13. The power module of claim 11, further comprising a plurality of wires on the chips and connected with the metallic layer, wherein the metallic layer comprises:
a drain pattern, wherein the chips are disposed on the drain pattern, and the drain of the chip is connected with the drain pattern;
a source pattern adjacent to the drain pattern and is spaced apart from the drain pattern, wherein the bonding bodies connect the source pattern and the metal plate; and
a gate pattern adjacent to the drain pattern and is spaced apart from the drain pattern, wherein the wire is connected with the gate pattern and the gate of the chip.

14. The power module of claim 13, further comprising:
a baseplate under the substrate; and
a housing surrounding the baseplate.

15. The power module of claim 14, further comprising:
a first terminal connected with the source pattern, wherein the first terminal is on the housing;
a second terminal connected with the drain pattern, wherein the second terminal is on the housing; and
a third terminal on the gate pattern, wherein the third terminal is a pin terminal.

16. The power module of claim 14, further comprising:
a first terminal connected with the source pattern, wherein the first terminal is on the housing;
a second terminal connected with the drain pattern, wherein the second terminal is on the housing; and
a fourth terminal connected with the gate pattern.

17. The power module of claim 11, wherein the metal plate extends to right above the gate of at least one of the chips.

18. The power module of claim 11, wherein the supporting pillars and the chips are electrically connected by bonding materials, and a hardness of the bonding materials is lower than that of the supporting pillars and the chips.

19. The power module of claim 11, wherein the supporting pillars and the metal plate are electrically connected by bonding materials, and the bonding materials are solder or silver sintering.

20. The power module of claim 11, wherein the supporting pillar is connected with the source of one of the chips and the metal plate.

* * * * *